(12) United States Patent
Nakamura et al.

(10) Patent No.: US 6,870,302 B2
(45) Date of Patent: Mar. 22, 2005

(54) INTERDIGITAL TRANSDUCER, SURFACE ACOUSTIC WAVE FILTER, AND RADIO COMMUNICATION APPARATUS

(75) Inventors: Hiroyuki Nakamura, Katano (JP); Ken Matsunami, Kyoto (JP); Kazunori Nishimura, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/875,845

(22) Filed: Jun. 24, 2004

(65) Prior Publication Data

US 2004/0227430 A1 Nov. 18, 2004

Related U.S. Application Data

(62) Division of application No. 10/271,269, filed on Oct. 15, 2002.

(30) Foreign Application Priority Data

Oct. 16, 2001 (JP) ........................................ 2001-318622

(51) Int. Cl.[7] .................. H01L 41/04; H01L 41/08; H01L 41/18; H02N 2/00; H03H 9/145
(52) U.S. Cl. ............................. 310/313 B; 310/313 A; 310/313 R; 333/195; 333/194
(58) Field of Search .................... 310/313 A, 313 B, 310/313 C, 313 D, 313 R; 333/193, 195

(56) References Cited

U.S. PATENT DOCUMENTS

| 5,581,141 A | 12/1996 | Yamada et al. | 310/313 D |
| 5,663,695 A | 9/1997 | Sugiyama et al. | 333/193 |

(List continued on next page.)

FOREIGN PATENT DOCUMENTS

| JP | 11-186865 | 7/1999 | .......... H03H/9/145 |
| JP | 11-205081 A | 7/1999 | ............ H03H/9/64 |

(List continued on next page.)

OTHER PUBLICATIONS

Nakamura et al., "A New Design Concept for Low–Loss SAW Filters Based on Different–Width Split–Finger SPUDT", IEEE Transactions on Microwave Theory and Techniques, IEEE Inc., New York, US, vol. 49, No. 4, Part 2, Apr., 2001, pp. 761–768.

European Search Report for EP 02 02 3014, dated Mar. 29, 2004.

"Overview of Design Challenges For Single Phase Unidirectional Saw Filters"—C.S. Hartmann & B.P. Abbott, 1989 Ultrasonics Symposium, pp. 79–89.

*Primary Examiner*—Darren Schuberg
*Assistant Examiner*—J. Aguirrechea
(74) *Attorney, Agent, or Firm*—RatnerPrestia

(57) ABSTRACT

An interdigital transducer has one-wavelength basic units of a single phase unidirectional transducer a plurality of each having three electrode fingers within one wavelength; and a plurality of one-wavelength basic units of a bidirectional electrode each having four electrode fingers within the one wavelength, wherein the one-wavelength basic units are properly arranged according to a desired filter characteristic, and one of the three electrode fingers of each one-wavelength basic unit of the single phase unidirectional transducer is wider than the two other electrode fingers, and of the four electrode fingers of each one-wavelength basic unit of the bidirectional electrode, one pair of two fingers is interdigitated to the other pair of two fingers, and an adjustment section is provided between the one-wavelength basic units of the single phase unidirectional transducer and the one-wavelength basic units of the bidirectional electrode.

6 Claims, 24 Drawing Sheets

U.S. PATENT DOCUMENTS

| | | | |
|---|---|---|---|
| 5,932,950 A | 8/1999 | Yamada et al. | 310/313 D |
| 5,990,762 A | 11/1999 | Nakamura et al. | 333/195 |
| 6,075,426 A | 6/2000 | Tsutsumi et al. | 333/193 |
| 6,104,260 A | 8/2000 | Yamada et al. | 333/193 |
| 6,127,904 A | 10/2000 | Tanaka et al. | 333/193 |
| 6,211,600 B1 * | 4/2001 | Martin | 310/313 D |
| 6,246,150 B1 | 6/2001 | Mitobe | 310/313 B |
| 6,348,845 B2 | 2/2002 | Nakamura et al. | 333/195 |
| 6,351,196 B1 | 2/2002 | Nakamura et al. | 333/193 |
| 6,414,414 B1 * | 7/2002 | Wright | 310/313 D |
| 6,469,598 B2 | 10/2002 | Tsuzuki et al. | 333/193 |
| 6,476,691 B1 | 11/2002 | Tsuzuki et al. | 333/193 |
| 6,496,086 B2 | 12/2002 | Tsuzuki et al. | 333/195 |
| 6,710,683 B2 * | 3/2004 | Nakamura et al. | 333/193 |
| 2002/0158715 A1 | 10/2002 | Nakamura et al. | 333/193 |

FOREIGN PATENT DOCUMENTS

| | | | |
|---|---|---|---|
| JP | 2000-077973 | 3/2000 | H03H/9/64 |
| JP | 2001-237666 | 8/2001 | H03H/9/145 |
| JP | 2002-043887 | 2/2002 | H03H/9/145 |
| JP | 2002-330048 | 11/2002 | H03H/9/145 |
| JP | 2003-017970 A | 1/2003 | H03H/9/145 |
| JP | 2003-179462 A | 6/2003 | H03H/9/64 |
| WO | WO 3005580 A1 | 1/2003 | H03H/9/145 |

* cited by examiner

Conventional filter characteristic (conventional bidirectional electrode used)

Filter characteristic (split electrode used, no λ/8 shift)

INTERDIGITAL TRANSDUCER, SURFACE ACOUSTIC WAVE FILTER, AND RADIO COMMUNICATION APPARATUS

This application is a divisional of U.S. patent application Ser. No. 10/271,269, filed Oct. 15, 2002.

BACKGROUND OF THE INVENTION

1. Field of the Invention

The present invention relates to a interdigital transducer for use in a transversal surface acoustic wave filter, a surface acoustic wave filter, and a radio communication apparatus.

2. Related Art of the Invention

As cellular phone terminals have become popular, their functions have been improved, while their sizes and power consumption have been reduced.

Under these circumstances, SAW (Surface Acoustic Wave) filters, characterized by consuming reduced power and having reduced sizes, have become essential for transmission and reception circuits of the cellular phone terminals.

FIG. 23 is a schematic view of a transversal SAW filter 407. The SAW filter 407 is mainly used for intermediate frequencies for a communication method such as CDMA.

The SAW filter 407 is composed of a piezoelectric substrate 401, an input IDT 402, an output IDT 403, an input terminal 404a, an input terminal 404b, an output terminal 405a, and an output terminal 405a. The IDT stands for an Interdigital Transducer.

Electric signals of intermediate frequencies input to the input terminals 404a, 404b as a pair of balanced terminals are converted into a surface acoustic wave by the input IDT 402. Then, the surface acoustic wave 406 propagates through the piezoelectric substrate 401 and is then converted into an electric signal again by the output IDT 403. The electric signal is output by the output terminals 405a, 405b as a pair of balanced terminals. In this manner, the SAW filter 407 operates as a transversal SAW filter.

FIG. 25 shows an IDT 1024 used as the input IDT 402.

The IDT 1024 is structured so that a plurality of electrode fingers are connected an upper bus bar electrode 224a and from a lower bus bar electrode 224b arranged opposite the upper bus bar electrode 224a. The upper bus bar electrode 224a and the lower bus bar electrode 224b are arranged parallel with a direction in which a surface acoustic wave propagates.

The IDT 1024 is composed of a section in which a surface acoustic wave is propagated in both directions and a section in which a surface acoustic wave is intensely propagated in one direction; the arrangement of the electrode fingers in the first section is different from that in the second section.

A bidirectional electrode 101 propagates a surface acoustic wave in two directions parallel with the upper bus bar electrode 224a and the lower bus bar electrode 224b. Further, a single phase unidirectional transducer (SPUDT) 102a located to the left of the bidirectional electrode 101 in the drawing intensely propagates a surface acoustic wave in a direction P in FIG. 25. Further, a single phase unidirectional transducer 102b located to the right of the bidirectional electrode 101 in the drawing intensely propagates a surface acoustic wave in the direction P in FIG. 25.

The bidirectional electrode 101 is structured so that a bidirectional electrode unit (a0)1 as a basic unit that propagates a surface acoustic wave in two directions parallel with the upper bus bar electrode 224a and a number of lower bus bar electrodes 224b are disposed at every distance equal to one wavelength of a surface acoustic wave at the predetermined frequency, and in FIG. 25, three successive bidirectional electrode units (a0) are disposed. The predetermined frequency of the surface acoustic wave is the center frequency of the surface acoustic wave excited on the piezoelectric substrate.

The bidirectional electrode units (a0)1 are each composed of four electrode fingers. The leftmost electrode finger in the drawing is connected the upper bus bar electrode 224a. The three other electrode fingers are connected the lower bus bar electrode 224b.

These four electrodes each have a width equal to one eighth of the wavelength at the above mentioned predetermined frequency.

The single phase unidirectional transducers 102a and 102b are called "EWC-SPUDT electrodes" and utilize reflection of a surface acoustic wave therein to propagate this wave in one direction. These electrodes have hitherto been known as a method with a small loss. The single phase unidirectional transducer 102a is composed of a number of single phase unidirectional transducer units (a)2 as basic units which propagates a surface acoustic wave in the direction P and which are disposed at every distance equal to one wavelength that the predetermined frequency. Likewise, the single phase unidirectional transducer 102b is composed of a number of single phase unidirectional transducer units (a)2 as basic units which propagates a surface acoustic wave in the direction P and which are disposed every distance equal to one wavelength at the above mentioned predetermined frequency.

In FIG. 25, the single phase unidirectional transducer 102a is composed of two successive single phase unidirectional transducer units (a)2. The single phase unidirectional transducer 102b is also composed of two successive single phase unidirectional transducer units (a)2.

The single phase unidirectional transducer unit (a)2 is composed of three electrode fingers. The leftmost electrode finger in the drawing is connected the upper bus bar electrode 224a. The electrode finger located immediately to the right of the leftmost finger is connected the lower bus bar electrode 224a. The rightmost electrode finger in the drawing is connected the lower bus bar electrode 224b. Further, rightmost electrode finger is wider than the two other electrode fingers. For example, the rightmost electrode finger has a width equal to one-fourth of the wavelength at the predetermined frequency. The two other electrode fingers have a width equal to one-eighth of the wavelength at the predetermined frequency.

In this manner, the IDT 1024 is constructed so that the single phase unidirectional transducers 102a and 102b are arranged at the respective ends of the bidirectional electrode 101. For all basic units composed of the single phase unidirectional transducer units (a)2 and bidirectional electrode units (a0)1, the space between the excitation centers of adjacent basic units is a multiple of the above described wavelength. Accordingly, in the IDT 1024 as a whole, a surface acoustic wave is intensely propagated in the direction P in FIG. 25.

Accordingly, the IDT 1024 can be used as the input IDT 402 of the SAW filter 407 in FIG. 23 by connecting the input terminal 404a to the upper bus bar electrode 224a and connecting the input terminal 404b to the lower bus bar electrode 224b.

Further, FIG. 26 shows an IDT 1025 used as the input IDT 402.

The IDT 1025 is structured so that single phase unidirectional transducers 112*a* and 112*b* are arranged at the respective sides of a bidirectional electrode 111. As with the IDT 1024 in FIG. 25, the bidirectional electrode 111 propagates a surface acoustic wave in two directions parallel with the upper bus bar electrode 224*a* and the lower bus bar electrode 224*b*. Further, both single phase unidirectional transducers 112*a* and 112*b* intensely propagate a surface acoustic wave in the direction P in FIG. 26 as with the IDT 1024 in FIG. 25.

The bidirectional electrode 111 is composed of three successive bidirectional electrode units (c0). The single phase unidirectional transducers 112*a* and 112*b* are each composed of two successive single phase unidirectional transducer units (c)12.

Bidirectional electrode units (c0)11 are each composed of four electrode fingers. The third electrode finger from the left in the drawing are connected the upper bus bar electrode 224*a*, and the other three electrode fingers are all connected the lower bus bar electrode 224*b*. Further, the single phase unidirectional transducer unit (c) 12 is composed of three electrode fingers. The leftmost electrode finger is connected the lower bus bar electrode 224*b*. The second electrode finger from the left is connected the upper bus bar electrode 224*a*. The third electrode finger from the left is connected the lower bus bar electrode 224*b*. Thus, the IDT 1025 has an arrangement of electrode fingers, i.e. basic units different from those of the IDT 1024. However, for all basic units composed of the single phase unidirectional transducer units (c)12 and bidirectional electrode units (c0)11, the space between the excitation centers of adjacent basic units is a multiple of the above described wavelength. Accordingly, in the IDT 1025 as a whole, a surface acoustic wave can be intensely propagated in the direction P in FIG. 26. The other arrangements are similar to those in FIG. 25.

Thus, the IDT 1025 can be used as the input IDT 402 of the SAW filter 407 in FIG. 23 by connecting the input terminal 404*a* to the upper bus bar electrode 224*a* and connecting the input terminal 404*b* to the lower bus bar electrode 224*b*.

However, in the bidirectional electrode unit (a)1, a basic unit of the bidirectional electrode 101 of the IDT 1024 in FIG. 25, one electrode finger is connected the upper bus bar electrode 224*a*, while three electrode fingers are connected the lower bus bar electrode 224*b*. Similarly, in the bidirectional electrode unit (c0)11, a basic unit of the bidirectional electrode 111 of the IDT 1025 in FIG. 26, one electrode finger is connected the upper bus bar electrode 224*a*, while three electrode fingers are connected the lower bus bar electrode 224*b*.

Thus, in the bidirectional electrode 101 of the IDT 1024, the number of electrode fingers connected the upper bus bar electrode 224*a* is different from the number of electrode fingers connected the lower bus bar electrode 224*b*. Only one electrode finger contributes to excitation derived from the upper bus bar electrode 224*a*. Thus, the electrode is inefficiently excited. Consequently, the use of the IDT 1024 results in a large loss to the SAW filter 407.

Similarly, in the bidirectional electrode 111 of the IDT 1025, the number of electrode fingers connected the upper bus bar electrode 224*a* is different from the number of electrode fingers connected the lower bus bar electrode 224*b*. Only one electrode finger contributes to excitation derived from the upper bus bar electrode 224*a*. Thus, the electrode is inefficiently excited. Consequently, the use of the IDT 1025 results in a large loss to the SAW filter 407.

That is, in IDTs comprising a combination of bidirectional electrodes and single phase unidirectional transducers, of the single phase unidirectional transducers the number of electrode fingers connected an upper bus bar electrode is different from the number of electrode fingers connected a lower bus bar electrode. Disadvantageously, only one electrode finger contributes to excitation derived from the upper bus bar electrode. Thus, the electrode is inefficiently excited.

SUMMARY OF THE INVENTION

In view of these problems, it is an object of the present invention to provide an interdigital transducer that is efficient and undergoes a reduced loss, a surface acoustic wave filter, and a radio communication apparatus.

One aspect of the present invention is an interdigital transducer comprising:

a plurality of one-wavelength basic units of a single phase unidirectional transducer each having three electrode fingers within one wavelength; and a plurality of one-wavelength basic units of a bidirectional electrode each having four electrode fingers within said one wavelength, wherein said one-wavelength basic units are properly arranged according to a desired filter characteristic, and one of the three electrode fingers of each one-wavelength basic unit of said single phase unidirectional transducer is wider than the two other electrode fingers, and of the four electrode fingers of each one-wavelength basic unit of said bidirectional electrode, one pair of two fingers is interdigitated to the other pair of two fingers, and an adjustment section is provided between the one-wavelength basic units of said single phase unidirectional transducer and the one-wavelength basic units of said bidirectional electrode.

Another aspect of the present invention is the interdigital transducer, wherein an excitation center of said at least one one-wavelength basic unit is substantially in phase with excitation centers of the other one-wavelength basic units.

Still another aspect of the present invention is the interdigital transducer, wherein if N is an integer equal to or larger than 1, said adjustment means that said plurality of excitation centers are set at positions corresponding to values N times as large as said one wavelength if the excitation centers correspond to the electrode fingers on the same side bus bar electrode of the one-wavelength basic unit, and are set at positions corresponding to values (N−(1/2)) times as large as said one wavelength if the excitation centers correspond to the electrode fingers on the opposite side bus bar electrode of the one-wavelength basic unit.

Yet still another aspect of the present invention is the interdigital transducer, wherein provision of said adjustment section means that in an area where a one-wavelength basic unit of said single phase unidirectional transducer and a one-wavelength basic unit of said bidirectional electrode are adjacent to each other, the space between an adjacent-side end of the one-wavelength basic unit of the single phase unidirectional transducer and an adjacent-side end of the one-wavelength basic unit of the corresponding bidirectional electrode is 2(M−1)/8 as large as said one wavelength, where M is an integer equal to or larger than 1.

Still yet another aspect of the present invention is the interdigital transducer, wherein said adjustment section has at least one electrode finger arranged therein.

A further aspect of the present invention is the interdigital transducer, further comprising at least two kinds of one-wavelength basic units of said single phase unidirectional transducer, the directivity of said one-wavelength basic units of single phase unidirectional transducer and the directivity of the other one-wavelength basic units of single phase unidirectional transducer are opposite directivity each other.

A still further aspect of the present invention is the interdigital transducer, further comprising:

an upper bus bar electrode from which some of said electrode fingers are connected; and a lower bus bar electrode from which the other electrode fingers are connected, wherein said single phase unidirectional transducer comprises at least two sections, and wide electrode fingers of those one-wavelength basic units of said single phase unidirectional transducer which constitute one section of said single phase unidirectional transducer are connected one of said upper bus bar electrode and said lower bus bar electrode, and wide electrode fingers of those one-wavelength basic units of said single phase unidirectional transducer which constitute the other section of said single phase unidirectional transducer are connected the other of said upper bus bar electrode and said lower bus bar electrode.

A yet further aspect of the present invention is the interdigital transducer, wherein signals directly or indirectly input by a pair of balanced terminals are input to said upper bus bar electrode and lower bus bar electrode, or signals directly or indirectly output to the pair of balanced terminals by said upper bus bar electrode and lower bus bar electrode are output by said upper bus bar electrode and lower bus bar electrode.

A still yet further aspect of the present invention is an surface acoustic wave filter comprising:

a piezoelectric substrate;

an input electrode formed on said piezoelectric substrate; and an output electrode formed on said piezoelectric substrate, wherein the interdigital transducer is used in at least a part of said input electrode and said output electrode.

An additional aspect of the present invention is a radio communication apparatus comprising:

a transmission circuit that outputs a transmitted wave; and a reception circuit that accepts a received wave as an input, wherein said transmission circuit and/or said reception circuit comprises the surface acoustic wave filter.

DESCRIPTION OF SYMBOLS

Figure 1:
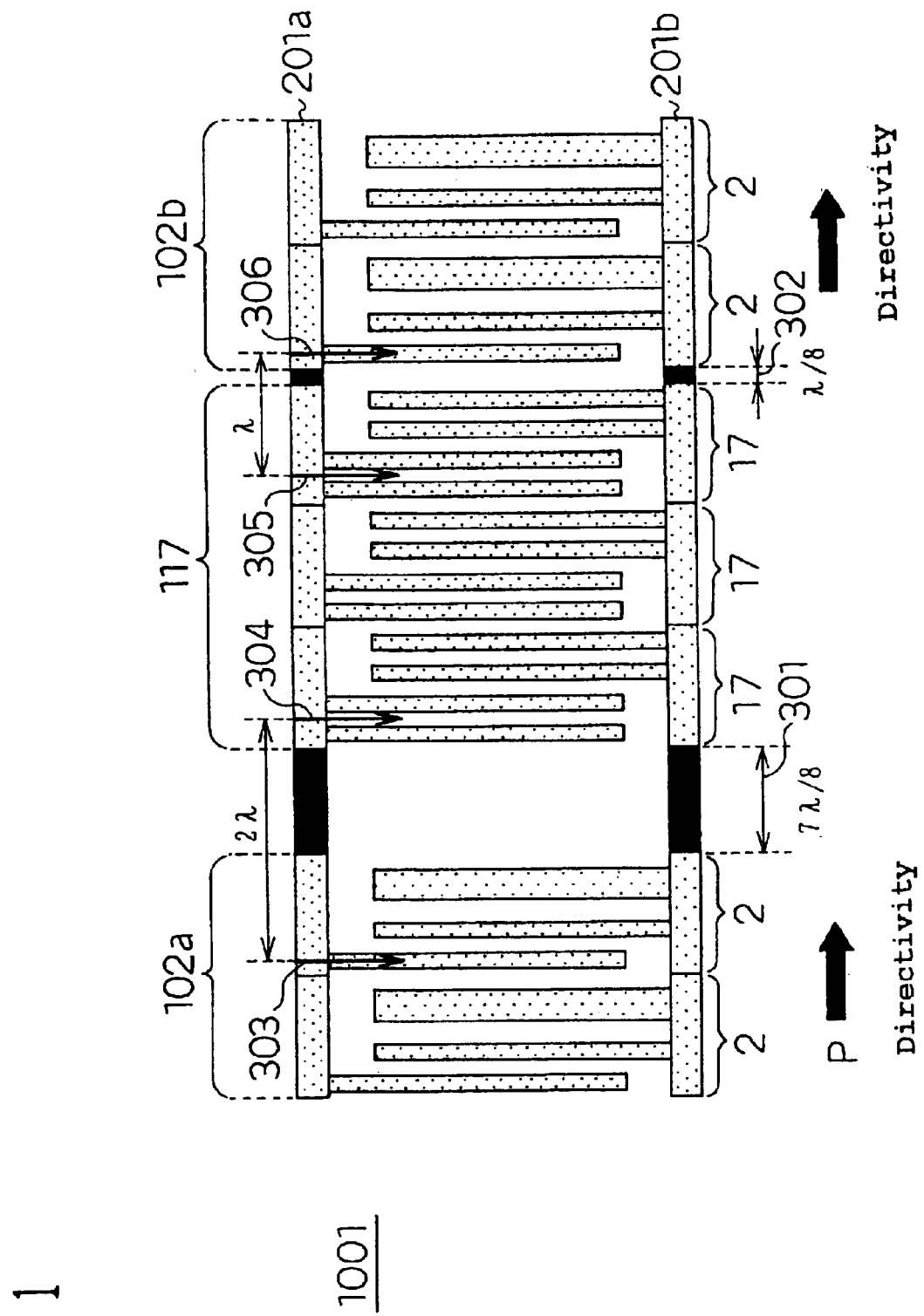
FIG. 1 is a diagram showing a configuration of an IDT according to a first embodiment of the present invention.

2 Single phase unidirectional transducer unit (a)
7 Single phase unidirectional transducer unit (b)
12 Single phase unidirectional transducer unit (c)
16 Split electrode (d0)
17 Split electrode (e0)
102a Single phase unidirectional transducer
102b Single phase unidirectional transducer
103 Single phase unidirectional transducer
107 Single phase unidirectional transducer
108 Single phase unidirectional transducer
117 Split electrode
301 Adjustment section
302 Adjustment section
303 Excitation center 304 Excitation center
305 Excitation center
306 Excitation center
310 Electrode finger
312 Electrode finger
313 Electrode finger
401 Piezoelectric substrate
402 Input IDT
403 Output IDT
404a Input terminal
404b Input terminal
405a Output terminal
405b Output terminal
407 SAW filter

PREFERRED EMBODIMENTS OF THE INVENTION

Embodiments of the present invention will be described below with reference to the drawings.
(First Embodiment)
First, a first embodiment will be described.
FIG. 1 shows an IDT 1001 according to this embodiment. The IDT 1001 is an interdigital transducer used as the input IDT 402 or output IDT 403 of the SAW filter 407 in FIG. 23 as with the prior art. Thus, the IDT 1001 is mainly used for intermediate frequencies for a communication method such as CDMA as with the prior art.

The IDT 1001 is structured so that a plurality of electrode fingers are connected an upper bus bar electrode 201a and from a lower bus bar electrode 201b arranged opposite the upper bus bar electrode 201a. The upper bus bar electrode 201a and the lower bus bar electrode 201b are arranged parallel with a direction in which a surface acoustic wave propagates.

The IDT 1001 is composed of a section in which a surface acoustic wave is propagated in both directions and a section in which a surface acoustic wave is intensely propagated in one direction.

A split electrode 117 propagates a surface acoustic wave in two directions parallel with the upper bus bar electrode 201a and the lower bus bar electrode 201b, and is called a "split finger electrode". Further, the single phase unidirectional transducer 102a located to the left of the slit electrode 117 in the drawing intensely propagates a surface acoustic wave in the direction P in FIG. 1. Further, the single phase unidirectional transducer 102b located to the right of the split electrode 117 in the drawing intensely propagates a surface acoustic wave in the direction P in FIG. 25. Namely, SPUDT 102a and 102b have the directivity toward P.

The split electrode 117 is structured so that a split electrode unit (e0) 17 as a basic unit are disposed at every distance equal to one wavelength of a surface acoustic wave at the predetermined frequency, and in FIG. 1, three successive split electrode units (e0) 17 are disposed. The predetermined frequency of the surface acoustic wave is the center frequency of the surface acoustic wave excited on the piezoelectric substrate.

The split electrode units (e0)17 are each composed of four electrode fingers. The leftmost and a pair adjacent electrode fingers in the direction against a paper face are connected the upper bus bar electrode 201a. The two other pair of two electrode fingers are connected the lower bus bar electrode 201b. These four electrodes each have a width equal to $\lambda/8$ where $\lambda$ denotes the wavelength at the above mentioned predetermined frequency.

The single phase unidirectional transducers 102a and 102b are the same as those described in the prior art section; these electrodes are called "EWC-SPUDT electrodes" and utilize reflection of a surface acoustic wave therein to propagate this wave in one direction. The single phase unidirectional transducer 102a is composed of a number of single phase unidirectional transducer units (a)2 as basic units which propagate intensely a surface acoustic wave in the direction P and which are disposed at every distance equal to the wavelength $\lambda$ at the predetermined frequency. Likewise, the single phase unidirectional transducer 102b is composed of a number of single phase unidirectional transducer units (a)2 as basic units which propagates a surface acoustic wave in the direction P and which are disposed at every distance equal to the wavelength $\lambda$ at the predetermined frequency.

In FIG. 1, the single phase unidirectional transducer 102a is composed of two successive single phase unidirectional transducer units (a)2. The single phase unidirectional transducer 102b is also composed of two successive single phase unidirectional transducer units (a)2.

The single phase unidirectional transducer units (a)2 are each composed of three electrode fingers. The leftmost electrode finger in the direction against the paper face is connected the upper bus bar electrode 201a. The electrode finger located immediately to the right of the leftmost electrode finger is connected the lower bus bar electrode 201b. The rightmost electrode finger is connected the lower bus bar electrode 201b. Further, the rightmost electrode finger is wider than the two other electrode fingers. That is, the rightmost electrode finger has a width equal to $\lambda/4$. The two other electrode fingers have a width equal to $\lambda/8$.

In this manner, the IDT 1001 is constructed so that the single phase unidirectional transducers 102a and 102b are arranged at the respective ends of the split electrode 117.

However, compared to the prior art, an adjustment section 301 with a width of $7\lambda/8$ is provided in an area in which the single phase unidirectional transducer 102a and the split electrode 117 lie adjacent to each other. Further, an adjustment section 302 with a width of $\lambda/8$ is provided in an area in which the split electrode 117 and the single phase unidirectional transducer 102b lie adjacent to each other.

In this manner, the following points are different from the prior art. That is, the IDT 1001 uses the split electrode 117 in place of the bidirectional electrode 101 of the conventional IDT 1024 or the bidirectional electrode 111 of the conventional IDT 1025, and is provided with the adjustment section 301 in the area in which the single phase unidirectional transducer 102a and the split electrode 117 lie adjacent to each other and the adjustment section 302 in the area in which the split electrode 117 and the single phase unidirectional transducer 102b lie adjacent to each other.

Figure 23:
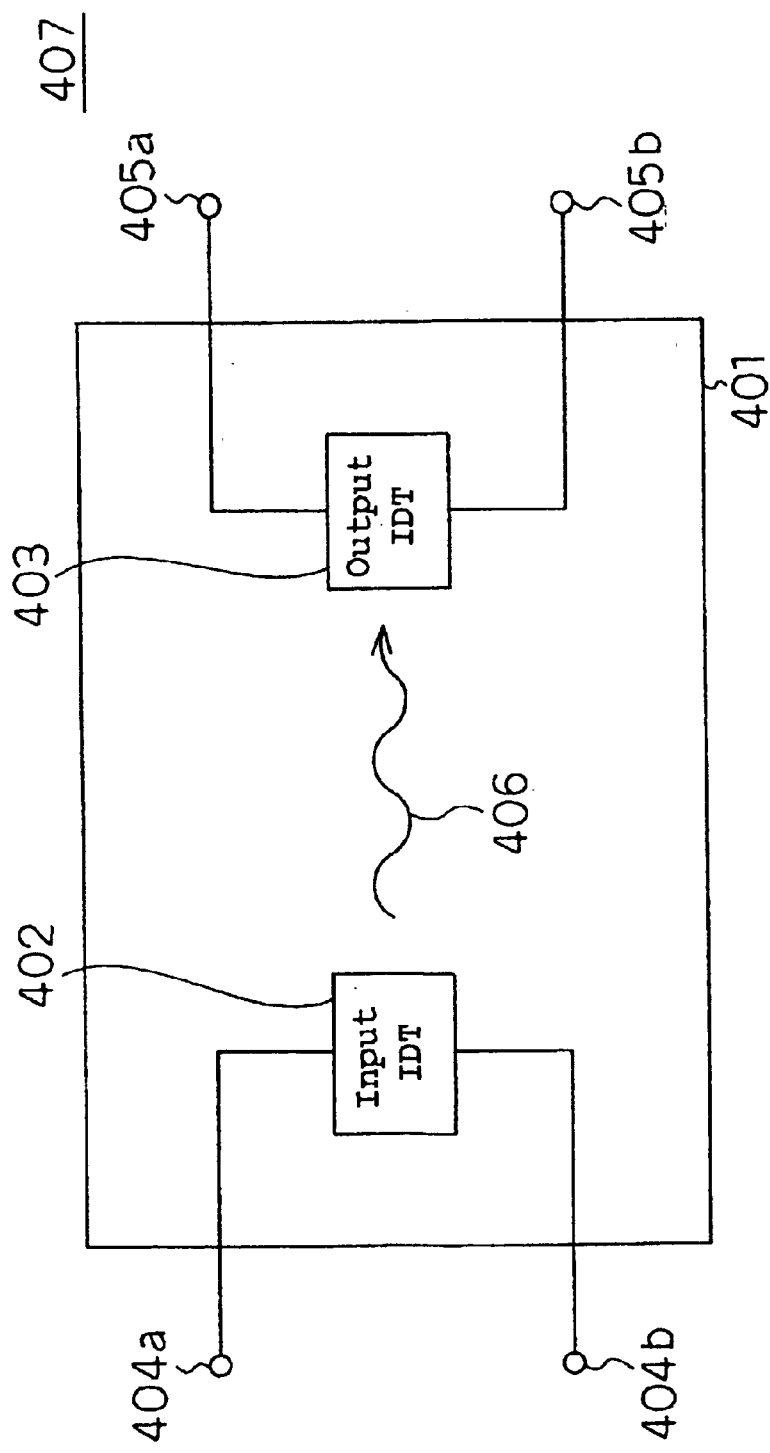
FIG. 23 is a diagram showing a configuration of an SAW filter for use in the embodiments of the present invention and in the prior art.

The IDT 1001 can be used as the input IDT 402 of the SAW filter 407 in FIG. 23 as with the prior art. That is, the IDT 1001 can be used as the input IDT 402 by connecting the input terminal 404a to the upper bus bar electrode 201a and connecting the input terminal 404b to the lower bus bar electrode 201b.

Now, the operation of this embodiment will be described.
If for example, the IDT 1001 is formed on the piezoelectric substrate 401, the input terminals 404a and 404b in FIG. 23 are connected to the upper bus bar electrode 201a and the lower bus bar electrode 201b, respectively, and input electric signals are input through the input terminals 404a and 404b, then a surface acoustic wave is excited on the piezoelectric substrate 401. The excited surface acoustic wave is reflected in the IDT 1001 and as a whole propagates in the direction P in FIG. 1.

At this time, the excitation center of the single phase unidirectional transducer unit (a)2 located immediately adjacent to the adjustment section 301 of the single phase unidirectional transducer 102a is defined as 303, and the excitation center 303 is assumed to be the center of the leftmost electrode finger of the single phase unidirectional transducer unit (a)2. On the other hand, the excitation center of the split electrode unit (e0)17 located adjacent to the adjustment section 301 of the split electrode 117 is defined as 304, and the excitation center 304 is assumed to be the position midway between the leftmost and adjacent electrode fingers of the split electrode unit (e0)17.

Further, the excitation center of the split electrode unit (e0)17 located adjacent to the adjustment section 302 of the split electrode 117 is defined as 305, and the excitation center 305 is assumed to be the position midway between the leftmost and adjacent electrode fingers of the split electrode unit (e0)17. On the other hand, the excitation center of the single phase unidirectional transducer unit (a)2 located immediately adjacent to the adjustment section 302 of the single phase unidirectional transducer 102b is defined as 306, and the excitation center 306 is assumed to be the center of the leftmost electrode finger of the single phase unidirectional transducer unit (a)2.

The space between the excitation centers 303 and 304 is twice as large as the above described wavelength $\lambda$. The space between the excitation centers 305 and 306 is equal to the wavelength $\lambda$. Further, the space between the excitation centers of the other adjacent basic units is equal to the wavelength $\lambda$. Consequently, the IDT 1001 of this embodiment can excite a surface acoustic wave without canceling it.

This will be described in comparison with the conventional IDT 1024 or 1025. In the conventional IDT 1024 or 1025, all basic units have the excitation center formed at a point located the same distance away from the left (right) end thereof irrespective of whether the basic units are of the same type or of different types. Accordingly, the space between the excitation centers of adjacent basic units is such that a surface acoustic wave can be excited without being cancelled.

On the other hand, in the IDT 1001 of this embodiment, the split electrode unit (e0)17 is used as the split electrode 117. The split electrode unit (e0)17 is structured so that two electrode fingers are connected each of the upper bus bar electrode 201a and the lower bus bar electrode 201b. Therefore, it has improved excitation efficiency compared to the conventional single phase unidirectional transducer unit (a0)1 or (c0)11.

However, the split electrode unit (e0)17 differs from the single phase unidirectional transducer unit (a)2 in the distance from the left (or right) end to the excitation center. That is, in the split electrode unit (e0)17, the excitation center is formed at the point midway between the two electrode fingers connected the upper bus bar electrode 201a. On the other hand, in the single phase unidirectional transducer unit (a)2, the excitation center is formed in the center of the leftmost electrode finger. Accordingly, the space between the left (right) end and excitation center of the split electrode unit (e0)17 is larger (smaller) than that of the single phase unidirectional transducer unit (a)2 by $\lambda/8$. That is, the position of the excitation center of the split electrode unit (e0) is closer to the right end of the drawing by $\lambda/8$ than that of the single phase unidirectional transducer unit (a)2.

Likewise, if the single phase unidirectional transducer unit (a)2 and the split electrode unit (e0)17 are simply located adjacent to each other as with the prior art, i.e. the adjustment sections 301 and 302 are not provided, then the space between the excitation center of the single phase unidirectional transducer unit (a)2 and the excitation center of the split electrode (e0)17 is not equal to a multiple of the wavelength $\lambda$.

That is, if the split electrode unit (e0) 17 is connected directly to the single phase unidirectional transducer (a)2 to the right thereof, then the space between the excitation centers of these basic units is $9\lambda/8$. On the other hand, if the single phase unidirectional transducer unit (a)2 is connected directly to the split electrode (e0)18 to the right thereof, then the space between the excitation centers of these basic units is $7\lambda/8$. Thus, the phase of a surface acoustic wave deviates in these areas.

Thus, in the IDT 1001 of this embodiment, the adjustment section 301 of length $7\lambda/8$ is provided in the area in which the split electrode unit (e0)17 is connected to the single phase unidirectional transducer (a)2 to the right thereof. Further, the adjustment section 302 of length $\lambda/8$ is provided in the area in which the single phase unidirectional transducer unit (a)2 is connected to the split electrode (e0)17 to the right thereof.

In this manner, in the IDT 1001 of this embodiment, the adjustment sections 301 and 302 are provided so that if the single phase unidirectional transducer unit (a)2 and the split electrode unit (e0) 17 lie adjacent to each other, the space between the excitation center of the single phase unidirectional transducer unit (a)2 and the excitation center 304 of the split electrode (e0)17 is equal to a multiple of the above mentioned wavelength $\lambda$. Consequently, in the IDT 1001 of this embodiment, the space between the excitation centers of all adjacent basic units is a multiple of the above described wavelength. Therefore, a surface acoustic wave can be excited without being cancelled with each other by the basic units.

Now, description will be given of differences in filter characteristics between the conventional SAW filter 401 and the IDT 1001 of this embodiment used as the SAW filter 401.

Figure 12:
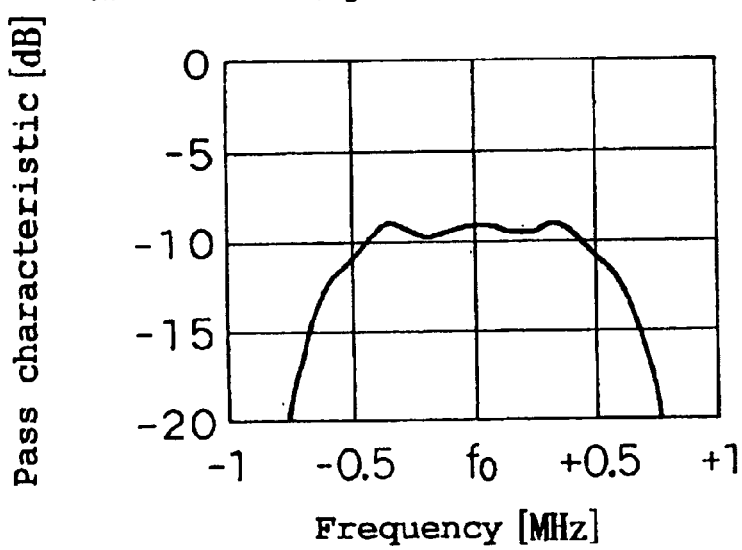
FIG. 12 is a chart showing a characteristic of a SAW filter using the IDT according to the first embodiment of the present invention.
Figure 13:
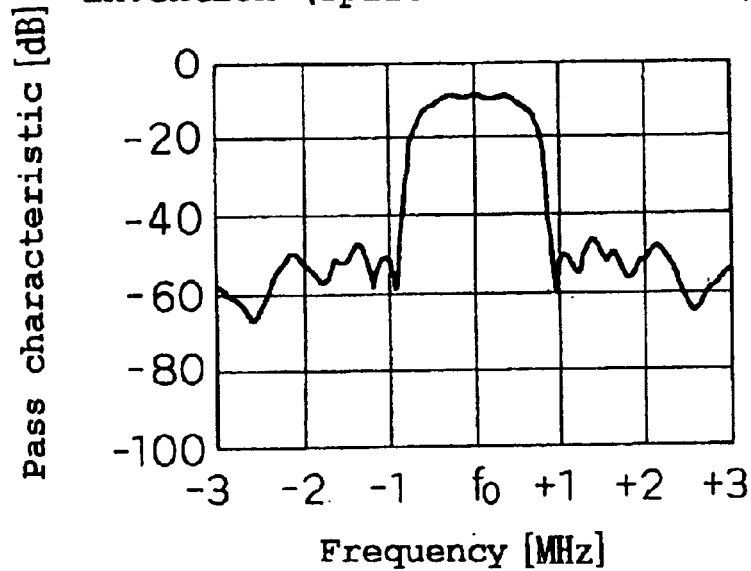
FIG. 13 is a enlarged chart showing a characteristic of a SAW filter using the IDT according to the first embodiment of the present invention.
Figure 14:
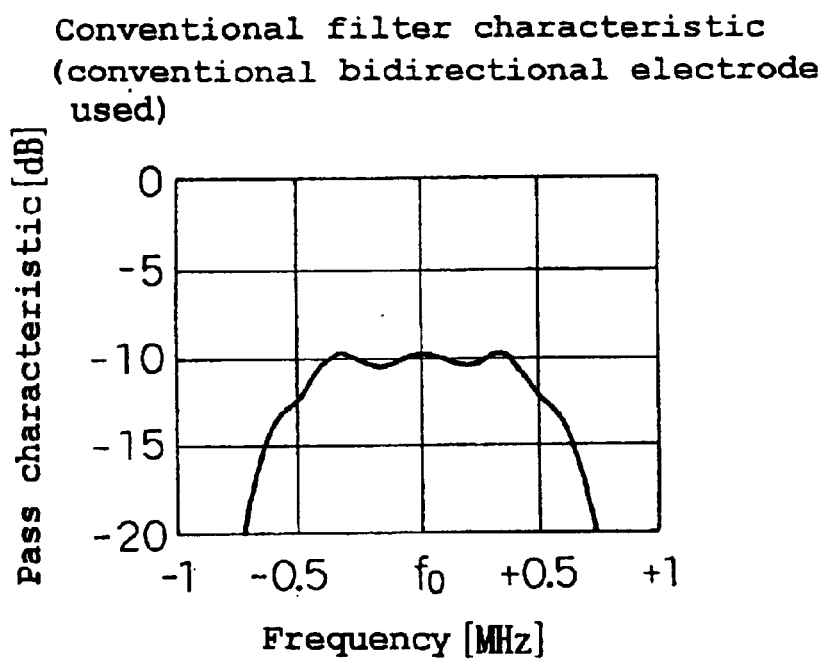
FIG. 14 is a chart showing a characteristic of a SAW filter using a conventional IDT.
Figure 15:
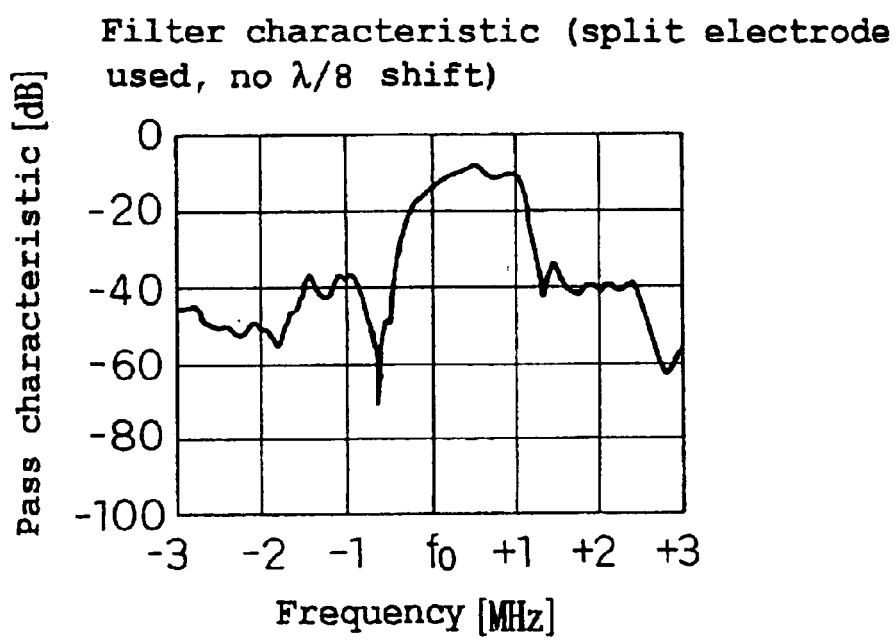
FIG. 15 is a chart showing a characteristic of a SAW filter using a IDT having no adjustment sections according to the first embodiment of the present invention.
Figure 25:
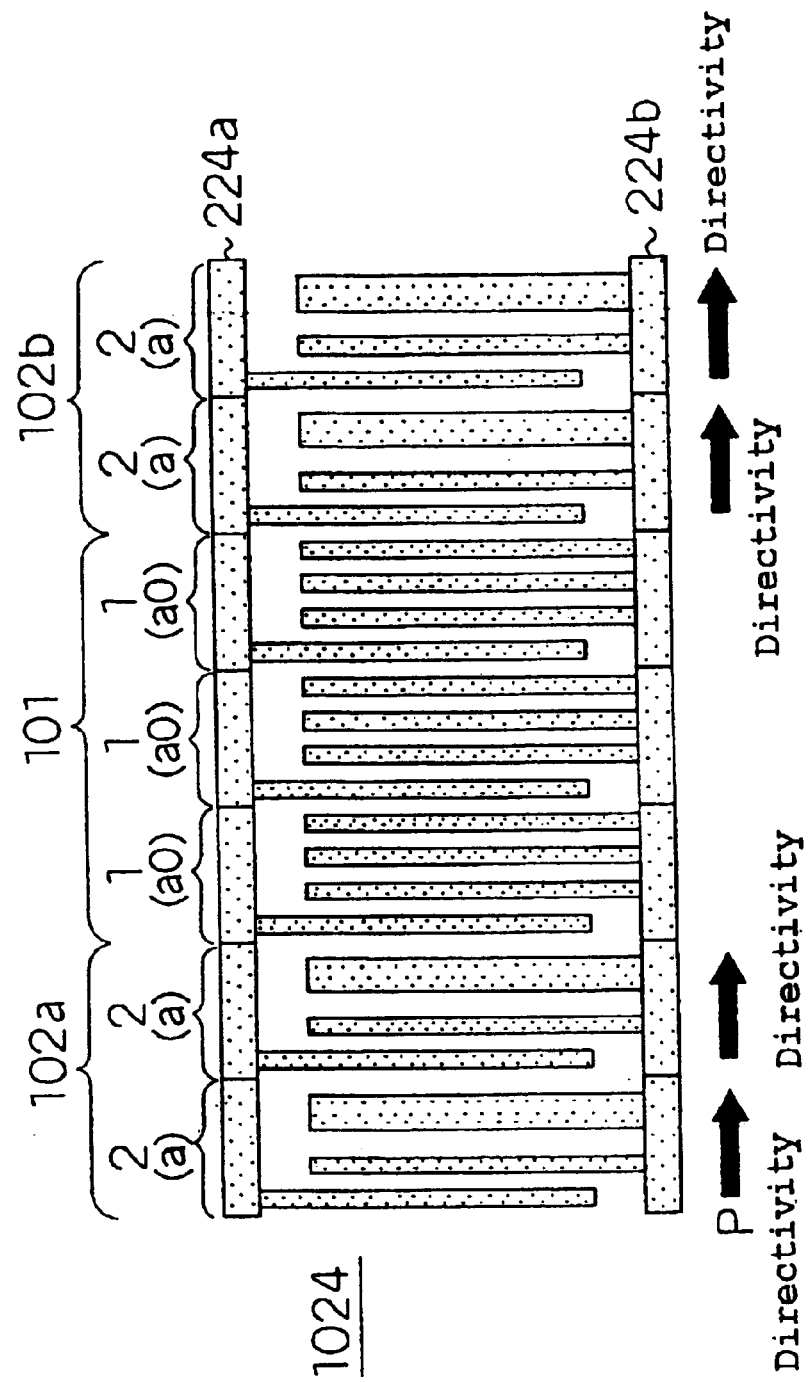
FIG. 25 is a diagram showing a configuration of a conventional IDT.
Figure 26:
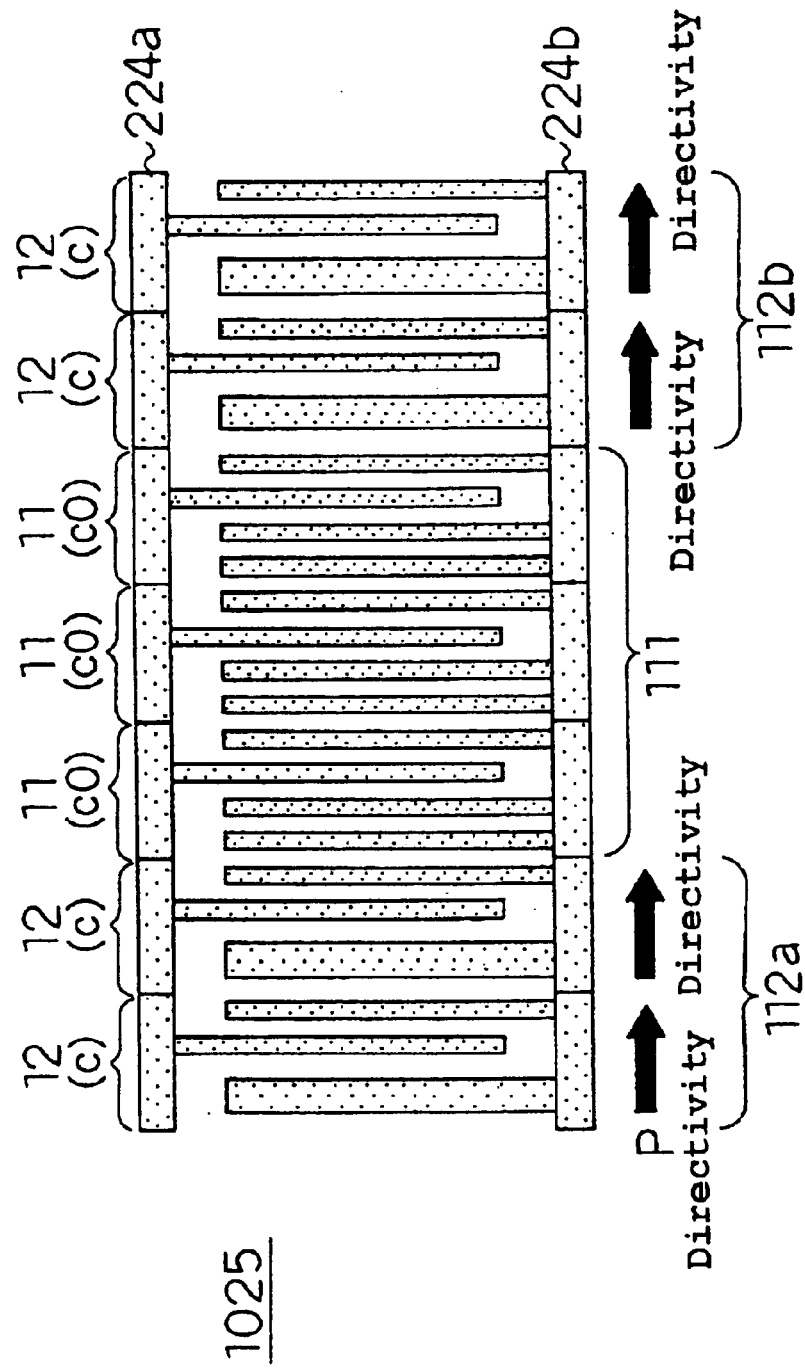
FIG. 26 is a diagram showing a configuration of another conventional IDT.

That is, FIG. 12 shows a filter characteristic observed when the IDT 1001 of this embodiment is used as each of the input IDT 402 and output IDT 403 of the SAW filter 407 in FIG. 23. However, the number of basic units in the input IDT 402 and output IDT 403 as well as the directivity and arrangement of the basic units are arbitrarily selected to obtain the desired filter characteristic. Further, FIG. 13 is an enlarged view of a center frequency portion of the filter characteristic in FIG. 12. Furthermore, FIG. 14 shows a filter characteristic observed when the IDT 1024, described in the prior art section with reference to FIG. 25, is used as each of the input IDT 402 and output IDT 403 of the SAW filter 407 in FIG. 23. Moreover, FIG. 15 shows a filter characteristic observed when an IDT having the same basic unit configuration as that of the IDT 1001 of this embodiment but not including the adjustment sections 301 and 302 is used as each of the input IDT 402 and output IDT 403 of the SAW filter 407 in FIG. 23. However, in FIGS. 12 and 13, the axis of abscissas indicates frequency, while the axis of ordinates indicates loss (dB).

Comparison of FIG. 12 with FIG. 13 indicates that the filter in FIG. 12 undergoes a loss about 1 dB decibel smaller than that in FIG. 13 within the pass band of the filters. That is, the use of the IDT 1001 of this embodiment reduces a possible loss compared to the IDT 1024, described in the prior art section.

Further, comparison of FIG. 13 with FIG. 15 indicates that the filter in FIG. 13 undergoes more attenuation outside the pass band of the filters and a smaller loss within the pass band, than the filter in FIG. 12. Furthermore, in FIG. 12, the characteristic of the pass band is more asymmetric than that of the center frequency. This is due to the deviation of the phases of the excitation centers of the basic units of the electrodes. Thus, the provision of the adjustment sections 301 and 302 improves the filter characteristic.

Therefore, using the IDT 1001 of this embodiment as the input IDT 402 or the output IDT 403 provides the SAW filter 407 undergoing a loss about 1 dB smaller than that occurring if the IDT 1024 or 1025, described in the prior art section, is used.

The number of basic units as well as the directivity and arrangement of the basic units are not limited to those described above, but may be optimally selected depending on the desired filter characteristic. For example, if the IDT 1001 is laterally inverted, a surface acoustic wave is propagated in the direction opposite to that of the IDT 1001. Alternatively, the IDT 1001 may be vertically inverted. Furthermore, the number of basic units in the split electrode 117 is not limited to three but may be one, two, or four or more. Moreover, the number of basic units in the single phase unidirectional transducer 102a or 102b is not limited to two but may be one or three or more.

Even if the number of basic units as well as the directivity and arrangement of the basic units are thus optimally selected depending on the desired filter characteristic, effects equivalent to those of this embodiment can be produced by providing the adjustment sections to substantially match the phases of the excitation centers with each other. Further, in the above description, the wide electrode finger has a width of $\lambda/4$. However, it may have a width of $3\lambda/8$ or another value provided that the corresponding single phase unidirectional transducer operates appropriately. Further in the above description, the width of a finger of sprit electrode is $\lambda/8$. However, it may be another???

(Second Embodiment)

Now, a second embodiment will be described.

Figure 2:
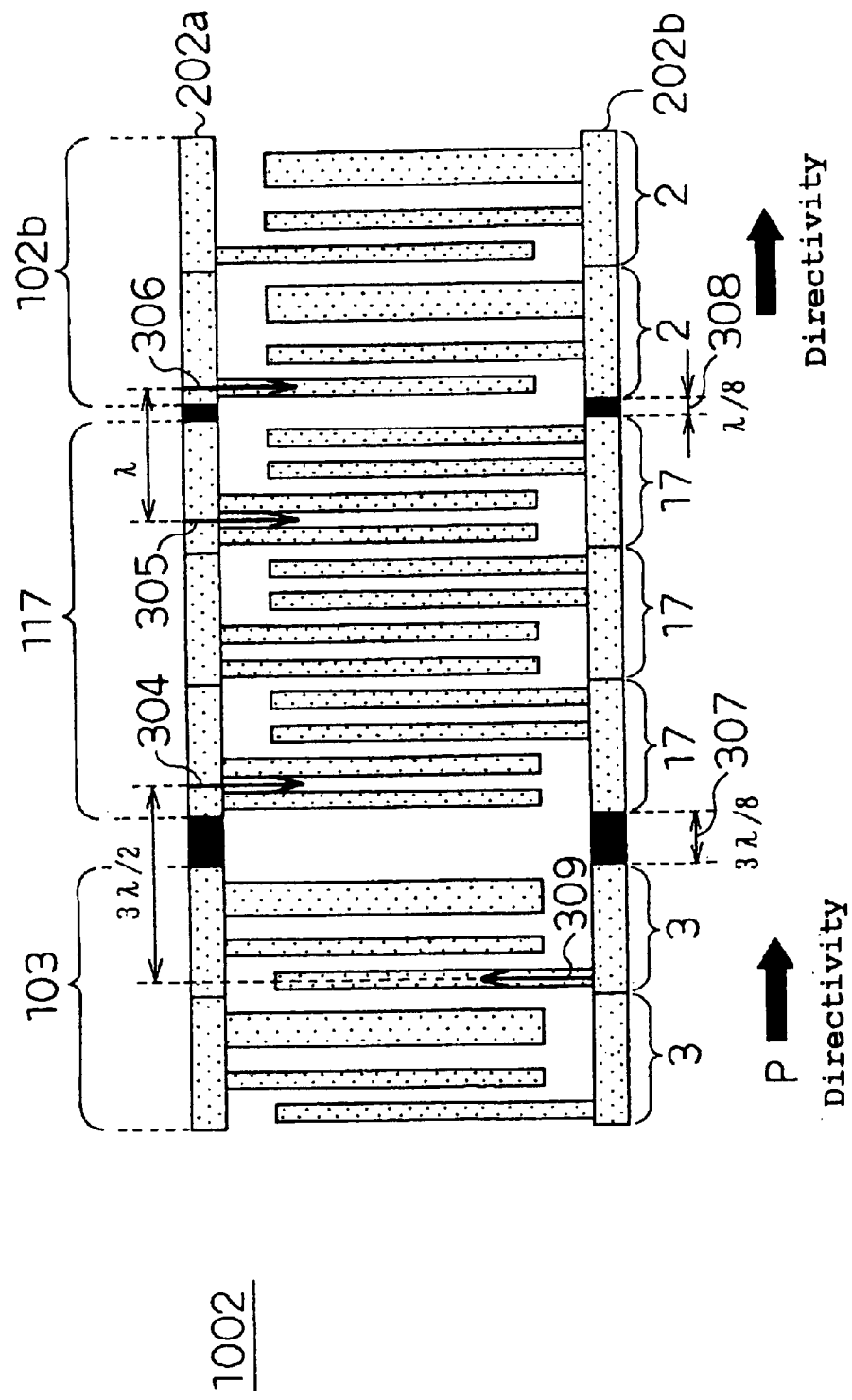
FIG. 2 is a diagram showing a configuration of an IDT according to a second embodiment of the present invention.

FIG. 2 shows an IDT 1002 according to this embodiment. The same components as those of the first embodiment are denoted by the same reference numerals, and detailed description thereof is omitted.

The IDT 1002 is an interdigital transducer used as the input IDT 402 of the SAW filter 407 in FIG. 23 as with the prior art.

The IDT 1002 is structured so that a plurality of electrode fingers are connected an upper bus bar electrode 202a and from a lower bus bar electrode 202b arranged opposite the upper bus bar electrode 202a. The upper bus bar electrode 202a and the lower bus bar electrode 202b are arranged parallel with a direction in which a surface acoustic wave travels.

The IDT 1002 is composed of a single phase unidirectional transducer 103, a split electrode 117, and a single phase unidirectional transducer 102b.

The structure of the single phase unidirectional transducer 103 is obtained by vertically inverting the structure of the single phase unidirectional transducer 102a of the first embodiment, vice versa. Further, an adjustment section 307 provided between the single phase unidirectional transducer 103 and the split electrode 117 corresponds, if the above described wavelength $\lambda$ is used, to a space of $3\lambda/8$.

The other arrangements are the same as those of the first embodiment.

Now, the operation of this embodiment will be described mainly in terms of differences between this embodiment and the first embodiment.

If for example, the IDT 1002 is formed on the piezoelectric substrate 401, the input terminals 404a and 404b in FIG. 23 are connected to the upper bus bar electrode 201a and the lower bus bar electrode 201b, respectively, and input electric signals are input through the input terminals 404a and 404b, as in the case with the first embodiment, then a surface acoustic wave is excited on the piezoelectric substrate 401. The excited surface acoustic wave is reflected in the IDT 1002 and as a whole propagates intensely in the direction P in FIG. 1 as a traveling wave. Namely, IDT 1002 has the directively toward P.

At this time, the excitation center of a single phase unidirectional transducer unit (a1)3 located immediately adjacent to the adjustment section 307 of the single phase unidirectional transducer 103a is defined as 309, and the excitation center 309 is assumed to be the center of the leftmost electrode finger of the single phase unidirectional transducer unit (a1)3. In this manner, in the second embodiment, the excitation center 309 is formed on the lower bus bar electrode 202b, whereas the excitation center 303 is formed on the upper bus bar electrode 201a according to the first embodiment.

On the other hand, the excitation center of the split electrode unit (e0)17 located adjacent to the adjustment section 307 of the split electrode 117 is defined as 304, and the excitation center 304 is assumed to be the position midway between the leftmost and adjacent electrode fingers of the split electrode unit (e0)17 similarly as the first embodiment.

Further, the excitation center of the split electrode unit (e0)17 located adjacent to an adjustment section 308 of the split electrode 117 is defined as 305, and the excitation center 305 is assumed to be the position midway between the leftmost and adjacent electrode fingers of the split electrode unit (e0)17 as with the first embodiment. On the other hand, the excitation center of the single phase unidirectional transducer unit (a)2 located immediately adjacent to the adjustment section 308 of the single phase unidirectional transducer 102b is defined as 306, and the excitation center 306 is assumed to be the center of the leftmost electrode finger of the single phase unidirectional transducer unit (a)2 as with the first embodiment.

The space between the excitation centers 309 and 304 is, if the wavelength $\lambda$ is used, $3\lambda/2$. That is, the phase of an input electric signal to the upper bus bar electrode 202a is opposite to the phase of an input electric signal to the lower bus bar electrode 202b. Consequently, since the space between the excitation centers 309 and 304 is $3\lambda/2$, a surface acoustic wave can be excited without being canceled with each other by both the single phase unidirectional transducer unit (a1) located adjacent to the adjustment section 301, and the split electrode unit (e0)17 located adjacent to the adjustment section 301.

Further, the space between the excitation centers 305 and 306 is equal to the wavelength $\lambda$ as with the first embodiment. Furthermore, the space between the excitation centers of the other adjacent basic units is equal to the wavelength $\lambda$. Consequently, the IDT 1001 of this embodiment can excite a surface acoustic wave without canceling it.

Thus, in this embodiment, the structure of the single phase unidirectional transducer 103 is obtained by vertically inverting the structure of the single phase unidirectional transducer 102a of the first embodiment, vice versa. Consequently, the adjustment section 301 of the first embodiment has a length of $7\lambda/8$, but in the second embodiment, the length can be reduced down to $3\lambda/8$ as demonstrated by the adjustment section 307. This enables a reduction in length of the upper and lower bus bar electrodes 202a and 202b of the IDT 1002 by $\lambda/2$ as compared with the first embodiment.

Further, the structure of the single phase unidirectional transducer 103 is obtained by vertically inverting the structure of the single phase unidirectional transducer 102b, vice versa. Thus, if the IDT 1002 of this embodiment is used as the input IDT 402 or output IDT 403 of the SAW filter in FIG. 23, then the impedance of the input terminal 404a is closer to that of the input terminal 404b than in the case in which the IDT 1001 of the first embodiment is used. Similarly, it is assumed that the impedance of the output terminal 405a can be made closer to that of the output terminal 405b. If the IDT 1002 of this embodiment is thus allowed to perform a balanced operation, a better balance is obtained than in the case where the IDT 1001 of the first embodiment is used.

(Third Embodiment)

Now, a third embodiment will be described.

Figure 3:
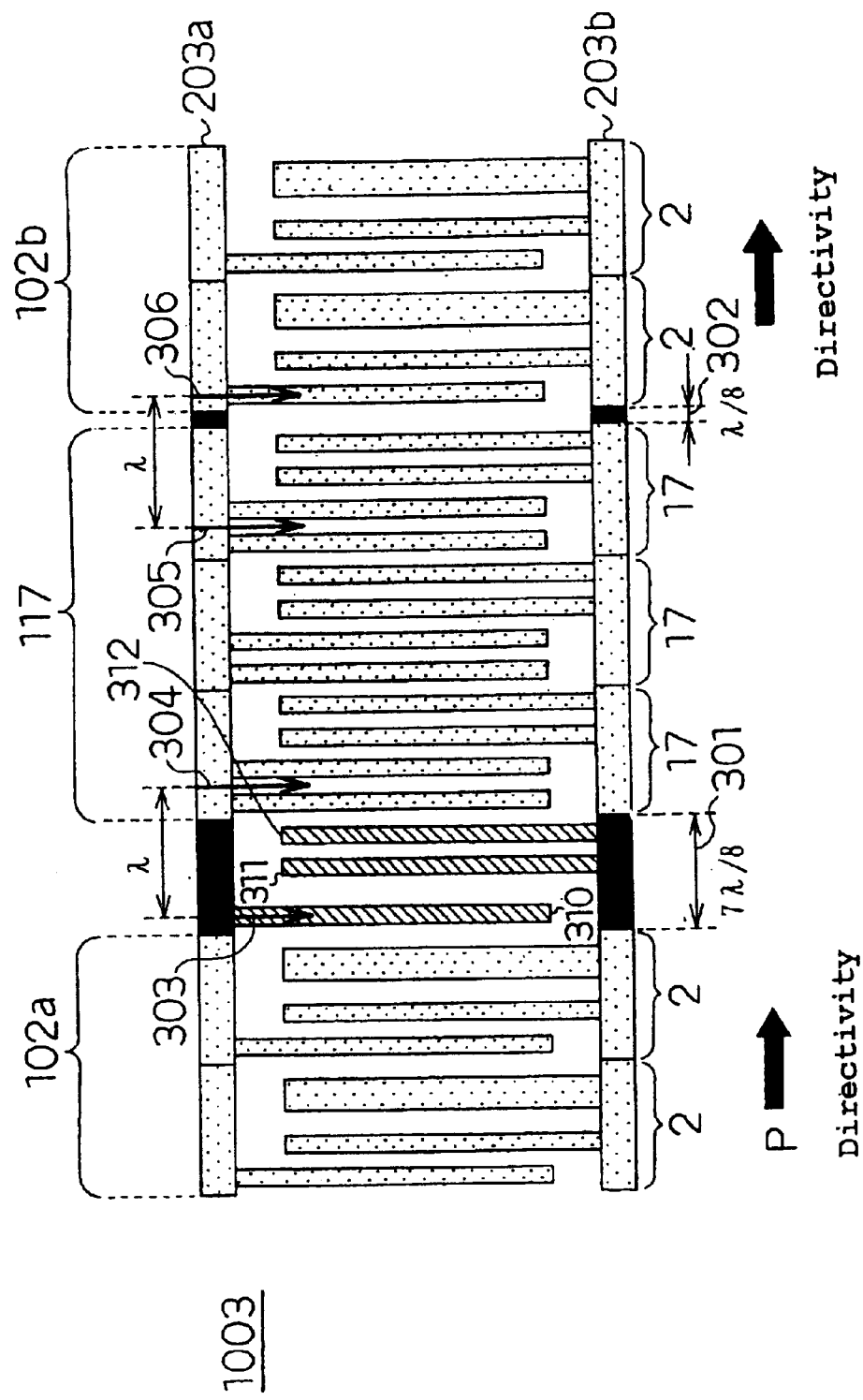
FIG. 3 is a diagram showing a configuration of an IDT according to a third embodiment of the present invention.

FIG. 3 shows an IDT 1003 according to this embodiment. The same components as those of the first embodiment are denoted by the same reference numerals, and detailed description thereof is omitted.

The IDT 1003 is an interdigital transducer used as the input IDT 402 of the SAW filter 407 in FIG. 23 as with the prior art.

The IDT 1003 is structured so that a plurality of electrode fingers are connected an upper bus bar electrode 203a and from a lower bus bar electrode 203b arranged opposite the upper bus bar electrode 203a. These components are the same as those of the first embodiment.

The IDT 1003 differs from the IDT 1001 of the first embodiment in that three electrode fingers 310, 311, and 312 are inserted into the adjustment section 301. That is, the leftmost electrode finger in the adjustment section 301 is connected the upper bus bar electrode 203a. The two other electrodes 311 and 312 are both connected the lower bus bar electrode 203b.

Now, the operation of this embodiment will be described mainly in terms of differences between this embodiment and the first embodiment.

The space between the excitation centers in the IDT 1003 is the same as that in the first embodiment. In the first embodiment, no electrode fingers are arranged in the area corresponding to the adjustment section 301. However, according to this embodiment, even if the electrode fingers 310, 311, and 312 are arranged, a surface acoustic wave can be excited without being canceled by both the single phase unidirectional transducer unit (a)2 located adjacent to the adjustment section 301 and the split electrode unit (e0) 17 located adjacent to the adjustment section 301.

Therefore, this embodiment does not only produce the effects of the first embodiment, but also makes the wave velocity of a surface acoustic wave uniform in the adjustment section 301 by inserting the electrode fingers 310, 311, and 312 in the adjustment section 301.

(Fourth Embodiment)

Now, a fourth embodiment will be described.

Figure 4:
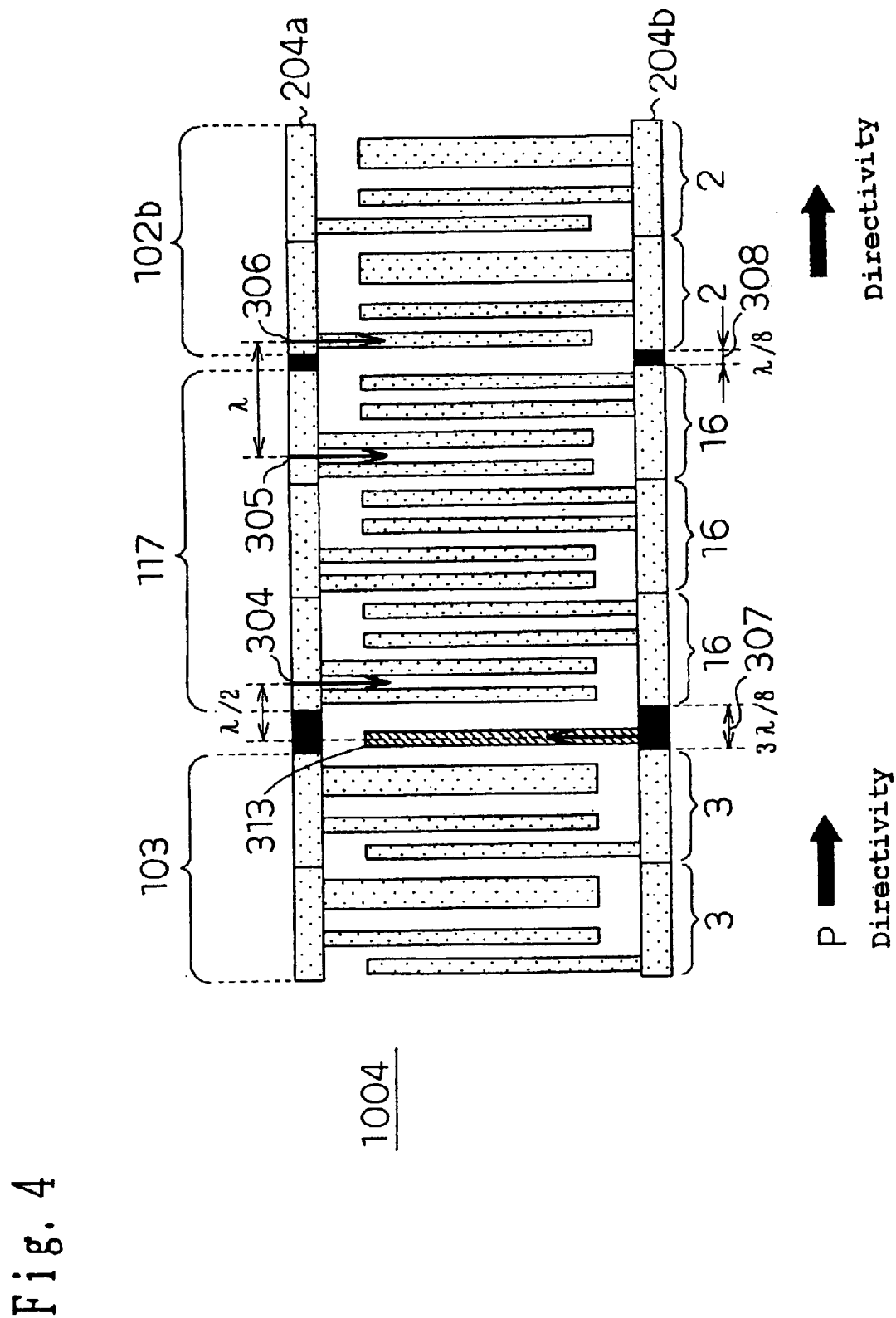
FIG. 4 is a diagram showing a configuration of an IDT according to a fourth embodiment of the present invention.

FIG. 4 shows an IDT 1004 according to this embodiment. The same components as those of the second embodiment are denoted by the same reference numerals, and detailed description thereof is omitted.

The IDT 1004 is an interdigital transducer as with the second embodiment, and is used as the input IDT 402 or output IDT 403 of the SAW filter 407 in FIG. 23 or the like as with the prior art.

The IDT 1004 is structured so that a plurality of electrode fingers are connected an upper bus bar electrode 204a and from a lower bus bar electrode 204b arranged opposite the upper bus bar electrode 204a. These components are the same as those of the second embodiment.

The IDT 1004 differs from the IDT 1002 of the second embodiment in that an electrode finger 313 is inserted into the adjustment section 301. That is, the electrode finger 313, arranged in the adjustment section 307, is connected the lower bus bar electrode 204a. The other arrangements are similar to those of the second embodiment.

Now, the operation of this embodiment will be described mainly in terms of differences between this embodiment and the second embodiment.

The space between the excitation centers in the IDT 1004 is the same as that in the second embodiment. In the second embodiment, no electrode fingers were arranged in the area corresponding to the adjustment section 307. However, according to this embodiment, even if the electrode finger 313 is arranged, a surface acoustic wave can be excited without being canceled by both the single phase unidirectional transducer unit (a)2 located adjacent to the adjustment section 307 and the split electrode unit (e0) 17 located adjacent to the adjustment section 307.

Therefore, this embodiment does not only produce the effects of the second embodiment but also makes the wave velocity of a surface acoustic wave uniform in the adjustment section 307 by inserting the electrode finger 313 in the adjustment section 307.

(Fifth Embodiment)

Now, a fifth embodiment will be described.

Figure 5:
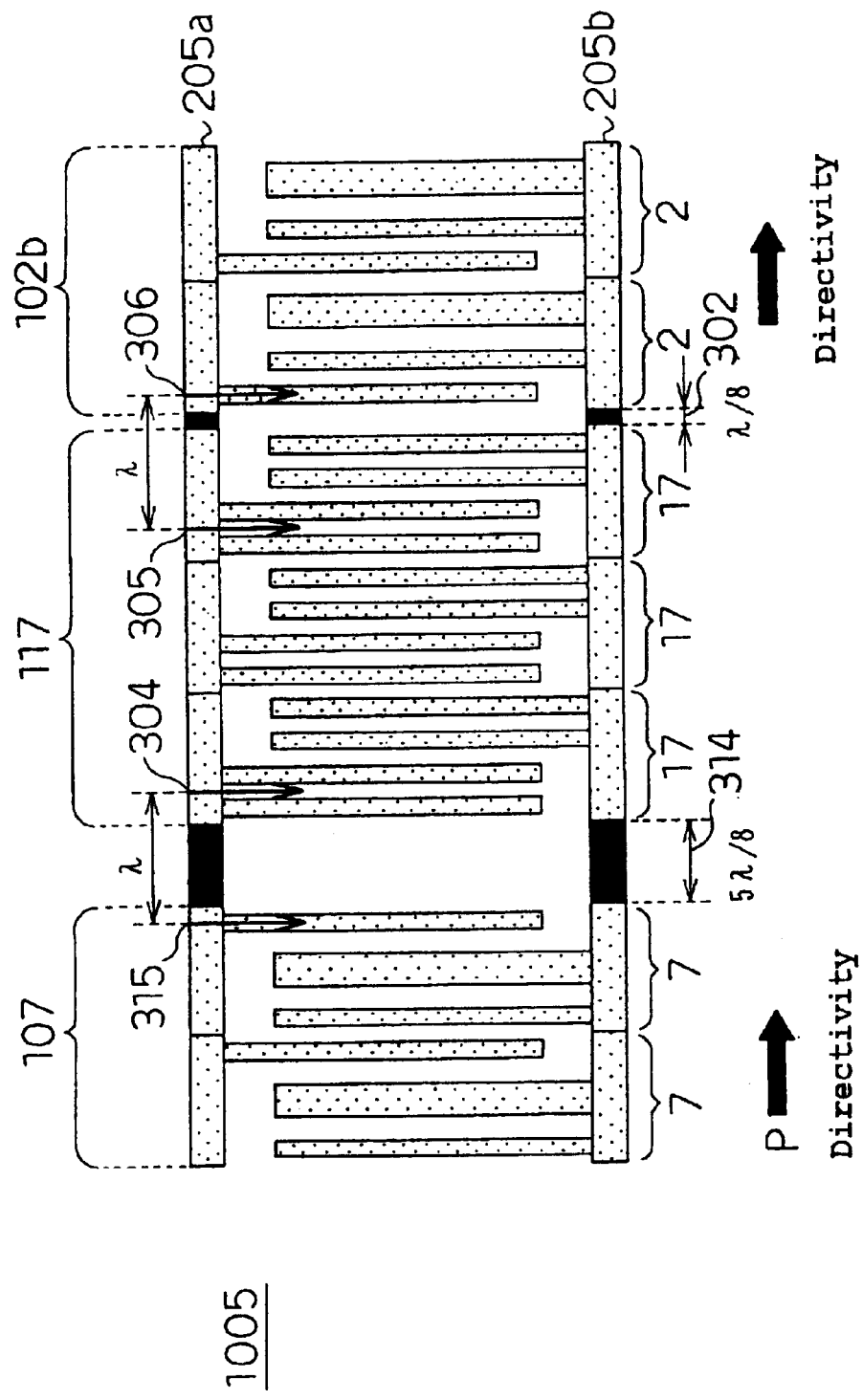
FIG. 5 is a diagram showing a configuration of an IDT according to a fifth embodiment of the present invention.

FIG. 5 shows an IDT 1005 according to this embodiment. The same components as those of the first embodiment are denoted by the same reference numerals, and detailed description thereof is omitted.

The IDT 1005 of this embodiment is structured so that a plurality of electrode fingers are connected an upper bus bar electrode 205a and from a lower bus bar electrode 205b arranged opposite the upper bus bar electrode 205a. The IDT 1005 is composed of the single phase unidirectional transducer 107, the split electrode 117, and the single phase unidirectional transducer 102b; the arrangements of the electrode fingers in these three sections are different from one another.

Further, the single phase unidirectional transducer 107 is composed of two successive single phase unidirectional transducer units (b)7 as basic units. The single phase unidirectional transducer unit (b)7 has a length which is equal to the above described wavelength $\lambda$ and within which three electrode fingers are arranged. In the single phase unidirectional transducer unit (b)7, the leftmost and adjacent electrode fingers are connected the lower bus bar electrode 205b, with the remaining one electrode finger connected the upper bus bar electrode 205a. Further, the electrode finger located adjacent to the leftmost electrode finger has a width of $\lambda/4$, while the two other electrode fingers have a width of $\lambda/8$. That is, the electrode finger located adjacent to the leftmost electrode finger is wider than the two other electrode fingers.

Further, an adjustment section 314 of length $5\lambda/8$ is provided in an area in which the single phase unidirectional transducer 107 and the split electrode 117 are arranged adjacent to each other.

The other arrangements are similar to those of the first embodiment.

Now, the operation of this embodiment will be described mainly in terms of differences between this embodiment and the first embodiment.

The excitation center of the single phase unidirectional transducer unit (b)7 is defined as 315. That is, the excitation center 315 corresponds to the center of the rightmost electrode finger of the single phase unidirectional transducer unit (b)7. Thus, the excitation center 315 is formed at a distance of 7λ/8 from the left end of the single phase unidirectional transducer unit (b)7.

On the other hand, the excitation center of the split electrode unit (e0)17 is defined as 304 as with the first embodiment, and is formed at a distance of λ/4 from the left end of the split electrode unit (e0)17.

Accordingly, if the adjustment section 314 is not provided, a space of 3λ/8 is formed between the excitation centers of the single phase unidirectional transducer center (b)7 and split electrode unit (e0)17 located adjacent to each other in the area in which the split electrode 117 is arranged to the right of the single phase unidirectional transducer 107. Consequently, the space between the excitation centers is not a multiple of the above mentioned wavelength λ. As a result, a surface acoustic wave has difference phases in the single phase unidirectional transducer unit (b)7 and in the split electrode unit (e0)17, the two electrode units being arranged adjacent to each other.

Thus, in the IDT 1005 of this embodiment, the adjustment section 314 of length 5λ/8 is provided between the single phase unidirectional transducer unit (b)7 and the split electrode unit (e0)17, arranged adjacent to each other. Consequently, the space between the excitation center 315 of the single phase unidirectional transducer unit (b) 7 and the excitation center 304 of the split electrode unit (e0) 17 is equal to the above mentioned wavelength λ. Further, the space between the excitation centers of the other adjacent basic units is equal to the above mentioned wavelength λ as in the case with the first embodiment.

Therefore, effects equivalent to those of the first embodiment can be produced by using the single phase unidirectional transducer unit (b)7, which has an electrode finger arrangement different from that of the first embodiment. Further, in the IDT 1005 of this embodiment, the single phase unidirectional transducer unit (b)7 can be used to reduce the length of the adjustment section compared to the first embodiment.

(Sixth Embodiment)

Now, a sixth embodiment will be described.

Figure 6:
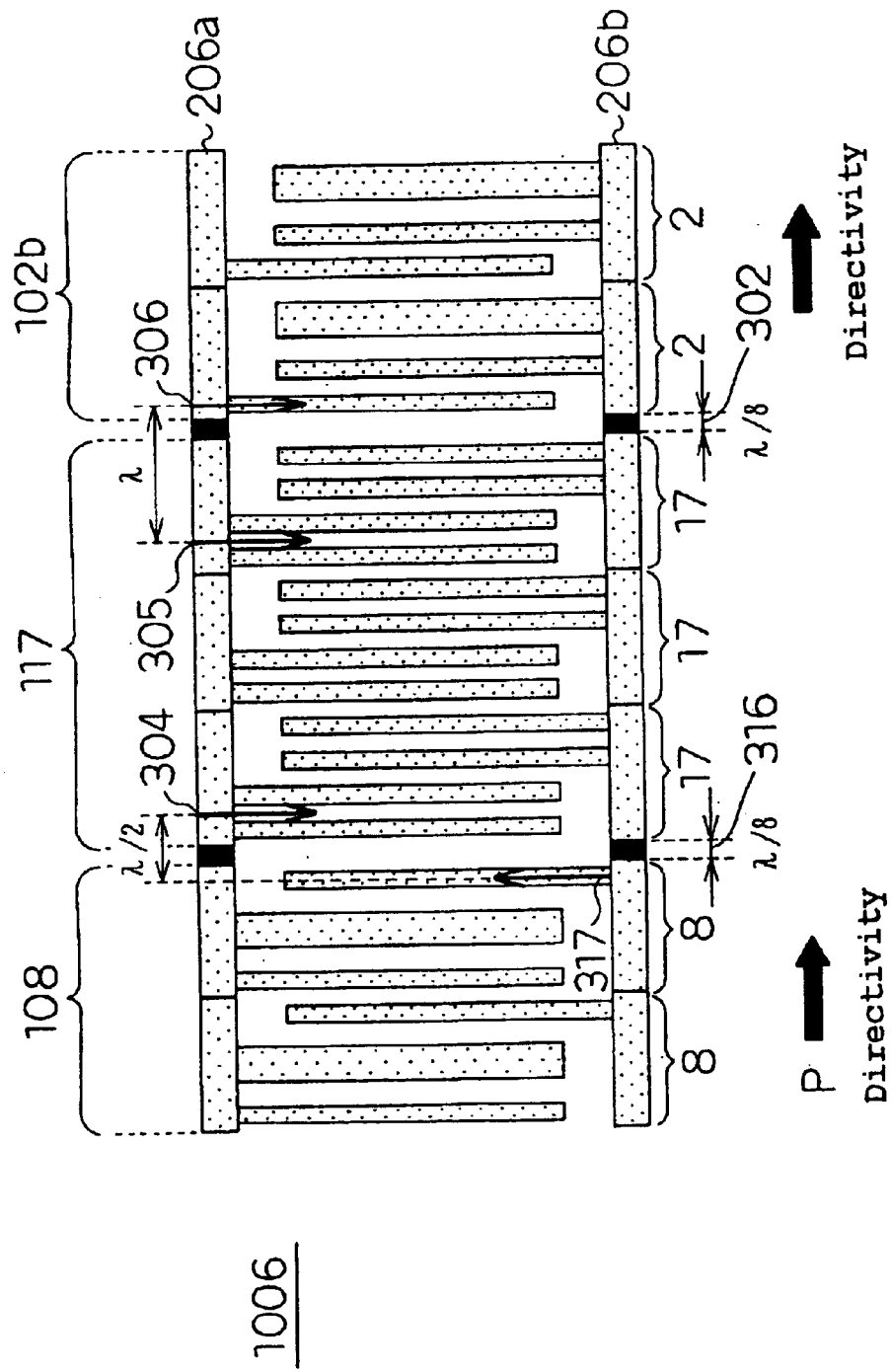
FIG. 6 is a diagram showing a configuration of an IDT according to a sixth embodiment of the present invention.

FIG. 6 shows an IDT 1006 according to this embodiment. The same components as those of the first embodiment are denoted by the same reference numerals, and detailed description thereof is omitted.

The IDT 1006 of this embodiment is structured so that a plurality of electrode fingers are connected an upper bus bar electrode 206a and from a lower bus bar electrode 206b arranged opposite the upper bus bar electrode 206a. The IDT 1006 is composed of the single phase unidirectional transducer 108, the split electrode 117, and the single phase unidirectional transducer 102b; the arrangements of the electrode fingers in these three sections are different from one another.

Further, the single phase unidirectional transducer 108 is composed of two successive single phase unidirectional transducer units (b1)8 as basic units. The structure of the single phase unidirectional transducer unit (b1)8 is obtained by vertically inverting the structure of the single phase unidirectional transducer unit (b)7, described in the fifth embodiment. That is, the single phase unidirectional transducer unit (b1)8 has a length which is equal to the above described wavelength λ and within which three electrode fingers are arranged. In the single phase unidirectional transducer unit (b1)8, the leftmost and adjacent electrode fingers are connected the upper bus bar electrode 206a, with the remaining one electrode finger connected the lower bus bar electrode 206b. Further, the electrode finger located adjacent to the leftmost electrode finger has a width of λ/4, while the two other electrode fingers have a width of λ/8. That is, the electrode finger located adjacent to the leftmost electrode finger is wider than the two other electrode fingers.

Further, an adjustment section 316 of length λ/8 is provided in an area in which the single phase unidirectional transducer 108 and the split electrode 117 are arranged adjacent to each other.

The other arrangements are similar to those of the first embodiment.

Now, the operation of this embodiment will be described mainly in terms of differences between this embodiment and the first embodiment.

The excitation center of the single phase unidirectional transducer unit (b1)8 is defined as 317. That is, the excitation center 317 corresponds to the center of the rightmost electrode finger of the single phase unidirectional transducer unit (b1)8. Thus, the excitation center 317 is formed at a distance of 7λ/8 from the left end of the single phase unidirectional transducer unit (b)7.

On the other hand, the excitation center of the split electrode unit (e0)17 is defined as 304 as with the first embodiment. Accordingly, the excitation center 304 is formed at a distance of λ/4 from the left end of the split electrode unit (e0)17.

Consequently, if the adjustment section 314 is not provided, a space of 3λ/8 is formed between the excitation centers of the single phase unidirectional transducer center (b1)8 and split electrode unit (e0)17 located adjacent to each other in the area in which the split electrode 117 is arranged to the right of the single phase unidirectional transducer 108. Further, since the excitation centers are vertically opposite to each other, the space between them is not equal to $(N-(1/2))\lambda$ where N is an integer equal to or larger than 1. As a result, the phase of a surface acoustic wave differs between the single phase unidirectional transducer unit (b1)8 and the split electrode unit (e0)17.

Thus, in the IDT 1006 of this embodiment, the adjustment section 316 of length λ/8 is provided between the single phase unidirectional transducer unit (b1)8 and the split electrode unit (e0)17, arranged adjacent to each other. This results in a space of λ/2 between the excitation center 317 of the single phase unidirectional transducer unit (b1)8 and the excitation center 304 of the split electrode unit (e0)17. Further, the space between the excitation centers of the other adjacent basic units is equal to the wavelength λ as in the case with the first embodiment.

Therefore, effects equivalent to those of the first embodiment can be produced by providing the adjustment section 316 even if the single phase unidirectional transducer 108 comprises the single phase unidirectional transducer unit (b1)8. Further, since the single phase unidirectional transducer 108 has a vertically inverted relationship with the single phase unidirectional transducer 102b, not only a good balance is obtained as in the case with the second embodiment but also the adjustment section 316 is shorter than the adjustment section 307 of the second embodiment.

(Seventh Embodiment)

Then, a seventh embodiment will be described.

Figure 7:
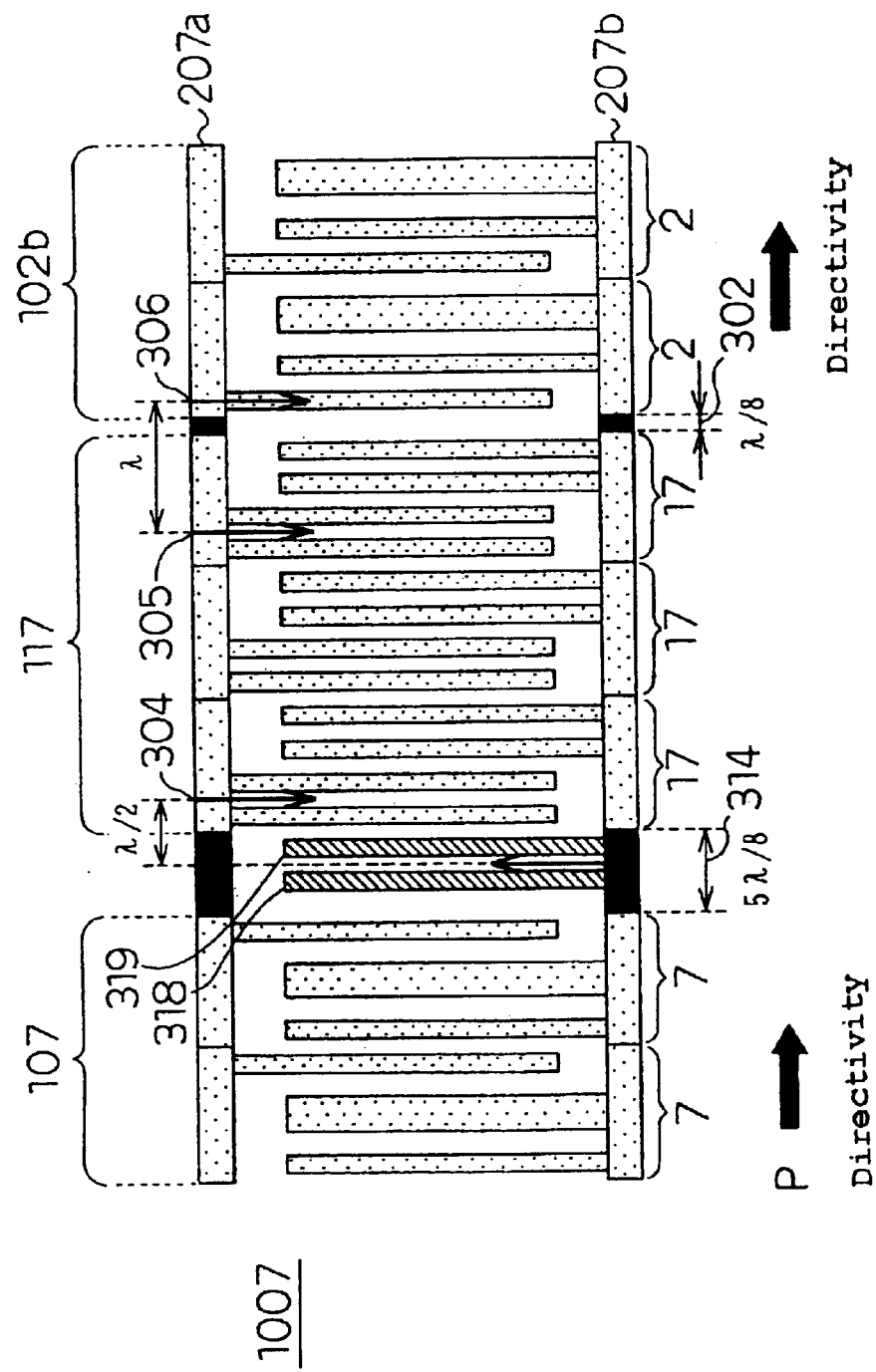
FIG. 7 is a diagram showing a configuration of an IDT according to a seventh embodiment of the present invention.

FIG. 7 shows an IDT 1007 according to this embodiment. The same components as those of the fifth embodiment are denoted by the same reference numerals, and detailed description thereof is omitted.

The IDT 1007 of this embodiment is structured so that a plurality of electrode fingers are connected an upper bus bar electrode 207a and from a lower bus bar electrode 207b arranged opposite the upper bus bar electrode 207a. The IDT 1007 is composed of the single phase unidirectional transducer 107, the split electrode 117, and the single phase unidirectional transducer 102b; the arrangements of the electrode fingers in these three sections are different from one another.

This embodiment differs from the fifth embodiment in that electrode fingers 318 and 319a are connected a portion of the lower bus bar electrode 207b which corresponds to the adjustment section 314. The other arrangements are similar to those of the fifth embodiment.

Now, the operation of this embodiment will be described mainly in terms of differences between this embodiment and the fifth embodiment.

The space between the excitation centers of the IDT 1007 is the same as that in the fifth embodiment. In the fifth embodiment, no electrode fingers are arranged in the area corresponding to the adjustment section 314. However, according to this embodiment, even if the electrode fingers 318 and 319 are disposed, a surface acoustic wave can be excited without being canceled by both the single phase unidirectional transducer unit (b)7 located adjacent to the adjustment section 314 and the split electrode unit (e0)17 located adjacent to the adjustment section 314.

Therefore, this embodiment does not only produce the effects of the fifth embodiment but also makes the wave velocity of a surface acoustic wave uniform in the adjustment section 314 by arranging the electrode fingers 318 and 319 in the adjustment section 314.

(Eighth Embodiment)

Now, an eighth embodiment will be described.

Figure 8:
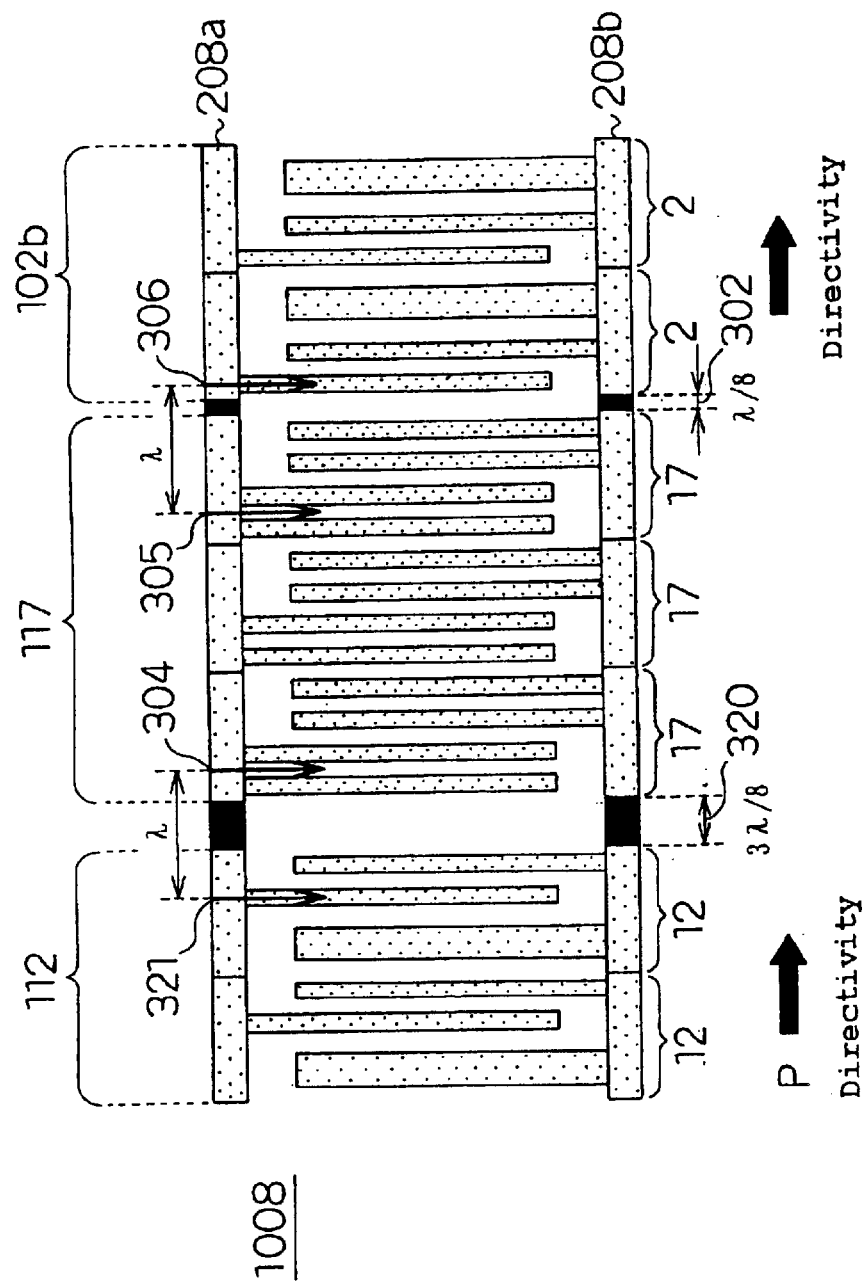
FIG. 8 is a diagram showing a configuration of an IDT according to an eighth embodiment of the present invention.

FIG. 8 shows an IDT 1008 according to this embodiment. The same components as those of the first embodiment are denoted by the same reference numerals, and detailed description thereof is omitted.

In the IDT 1008 of this embodiment, the single phase unidirectional transducer 102a of the first embodiment is replaced with the single phase unidirectional transducer 112, with the length of the adjustment section 320 set at $3\lambda/8$.

That is, the single phase unidirectional transducer 112 is composed of two successive single phase unidirectional transducer units (c)12. The single phase unidirectional transducer unit (c)12 has a length which is equal to the above described wavelength $\lambda$ and within which three electrode fingers are arranged. That is, of the three electrode fingers of the single phase unidirectional transducer unit (c)12, the leftmost electrode finger in the drawing is connected a lower bus bar electrode 208b. The electrode finger located to the right of the leftmost electrode finger is connected an upper bus bar electrode 208a. The electrode finger located to the right of the above electrode finger is connected the lower bus bar electrode 208b. Further, the leftmost electrode finger has a width of $\lambda/4$, while the two other electrode fingers have a width of $\lambda/8$. That is, the leftmost electrode finger of the single phase unidirectional transducer unit (c)12 is wider than the two other electrode fingers.

Further, an adjustment section 320 of length $3\lambda/8$ is provided in an area in which the single phase unidirectional transducer 112 and the split electrode 117 are arranged adjacent to each other.

The other arrangements are similar to those of the first embodiment, and description thereof is omitted.

Now, the operation of this embodiment will be described mainly in terms of differences between this embodiment and the first embodiment.

The excitation center of the single phase unidirectional transducer unit (c)12 located adjacent to the adjustment section 320 is defined as 321. Further, the excitation center of the split electrode unit 17 located adjacent to the adjustment section 320 is defined as 304. Then, on the basis of consideration similar to that in the first embodiment, the space between the excitation centers 321 and 304 is made equal to the above mentioned one wavelength $\lambda$ by setting the length of the adjustment section 320 at $3\lambda/8$.

Accordingly, the space between the excitation centers of every two basic units constituting the IDT 1008 of this embodiment is equal to the above mentioned one wavelength $\lambda$.

Thus, even if the single phase unidirectional transducer unit (c)12 is used as the single phase unidirectional transducer 112, a surface acoustic wave can be excited without being canceled with each other by the basic units, by setting the length of the adjustment section 320 at $3\lambda/8$.

Therefor, effects equivalent to those of the first embodiment can be produced by using the IDT 1008 of this embodiment.

(Ninth Embodiment)

Now, a ninth embodiment will be described.

Figure 9:
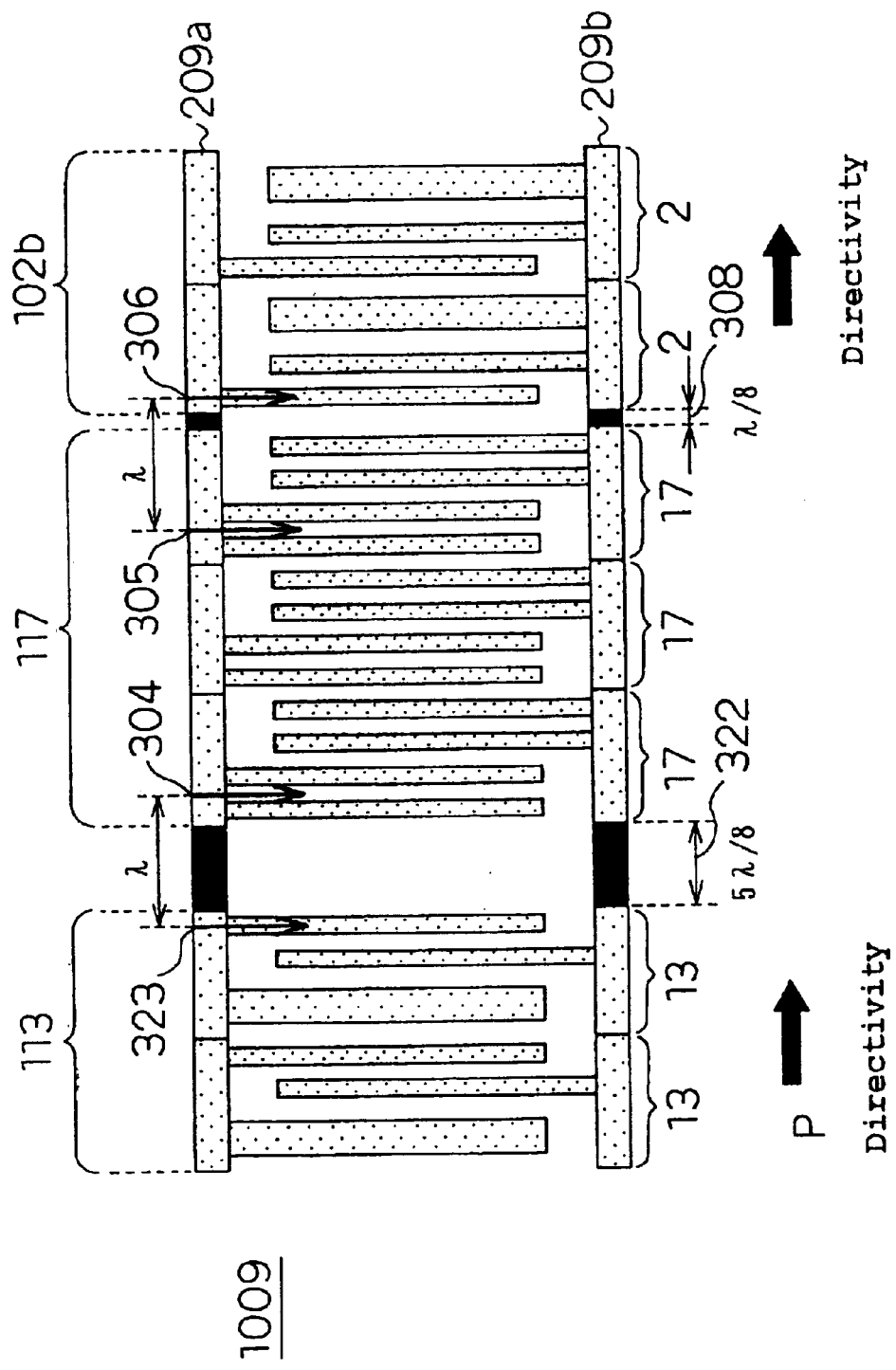
FIG. 9 is a diagram showing a configuration of an IDT according to a ninth embodiment of the present invention.

FIG. 9 shows an IDT 1009 according to this embodiment. The same components as those of the eighth embodiment are denoted by the same reference numerals, and detailed description thereof is omitted.

In the IDT 1009 of this embodiment, the single phase unidirectional transducer 112 of the eighth embodiment is replaced with the single phase unidirectional transducer 113, with the length of the adjustment section 320 set at $5\lambda/8$.

That is, the single phase unidirectional transducer 113 is composed of two successive single phase unidirectional transducer units (c1)13. That is, the structure of the single phase unidirectional transducer 113 is obtained by vertically inversing the single phase unidirectional transducer 112 of the eighth embodiment. That is, the single phase unidirectional transducer unit (c1)13 has a length which is equal to the above described wavelength $\lambda$ and within which three electrode fingers are arranged. Of the three electrode fingers of the single phase unidirectional transducer unit (c1)13, the leftmost electrode finger in the drawing is connected an upper bus bar electrode 209a. The electrode finger located to the right of the leftmost electrode finger is connected a lower bus bar electrode 209b. The electrode finger located to the right of the above electrode finger is connected the upper bus bar electrode 209a. Further, the leftmost electrode finger has a width of $\lambda/4$, while the two other electrode fingers have a width of $\lambda/8$. That is, the leftmost electrode finger of the single phase unidirectional transducer unit (c1)13 is wider than the two other electrode fingers.

Further, the adjustment section 320 of length $5\lambda/8$ is provided in an area in which the single phase unidirectional transducer 113 and the split electrode 117 are arranged adjacent to each other.

The other arrangements are similar to those of the eighth embodiment, and description thereof is omitted.

Now, the operation of this embodiment will be described mainly in terms of differences between this embodiment and the eighth embodiment.

The excitation center of the single phase unidirectional transducer unit (c1) 13 located adjacent to the adjustment section 322 is defined as 323. Further, the excitation center of the split electrode unit 17 located adjacent to the adjustment section 322 is defined as 304. Then, on the basis of consideration similar to that in the first embodiment, the space between the excitation centers 323 and 304 is made equal to the above mentioned one wavelength $\lambda$ by setting the length of the adjustment section 322 at $5\lambda/8$.

Accordingly, the space between the excitation centers of every two basic units constituting the IDT 1009 of this embodiment is equal to the one wavelength $\lambda$.

Thus, even if the single phase unidirectional transducer unit (c1)13 is used as the single phase unidirectional transducer 113, a surface acoustic wave can be excited without being canceled with each other by the basic units, by setting the length of the adjustment section 322 at 5λ/8.

Therefore, effects equivalent to those of the first embodiment can be produced by using the IDT 1009 of this embodiment.

Furthermore, in this embodiment, the side from which the wide electrode finger of the single phase unidirectional transducer 113 is connected is opposite to the side from which the wide electrode finger of the single phase unidirectional transducer 102b is connected. Moreover, in the single phase unidirectional transducer 113, two electrode fingers are connected the upper bus bar electrode 209a, while one electrode finger is connected the lower bus bar electrode 209b. On the other hand, in the single phase unidirectional transducer 102b, one electrode finger is connected the upper bus bar electrode 209a, while two electrode fingers are connected the lower bus bar electrode 209b. Accordingly, in the IDT 1009 of this embodiment, the number of electrode fingers connected the upper bus bar electrode 209a is equal to the number of electrode fingers connected the lower bus bar electrode 209b. Therefore, if the IDT 1009 of this embodiment is allowed to perform a balanced operation, a better balance is obtained than in the eighth embodiment. The balanced operation is similar to the one mentioned in the second embodiment, and detailed description thereof is thus omitted.

(Tenth Embodiment)

Now, a tenth embodiment will be described.

Figure 10:
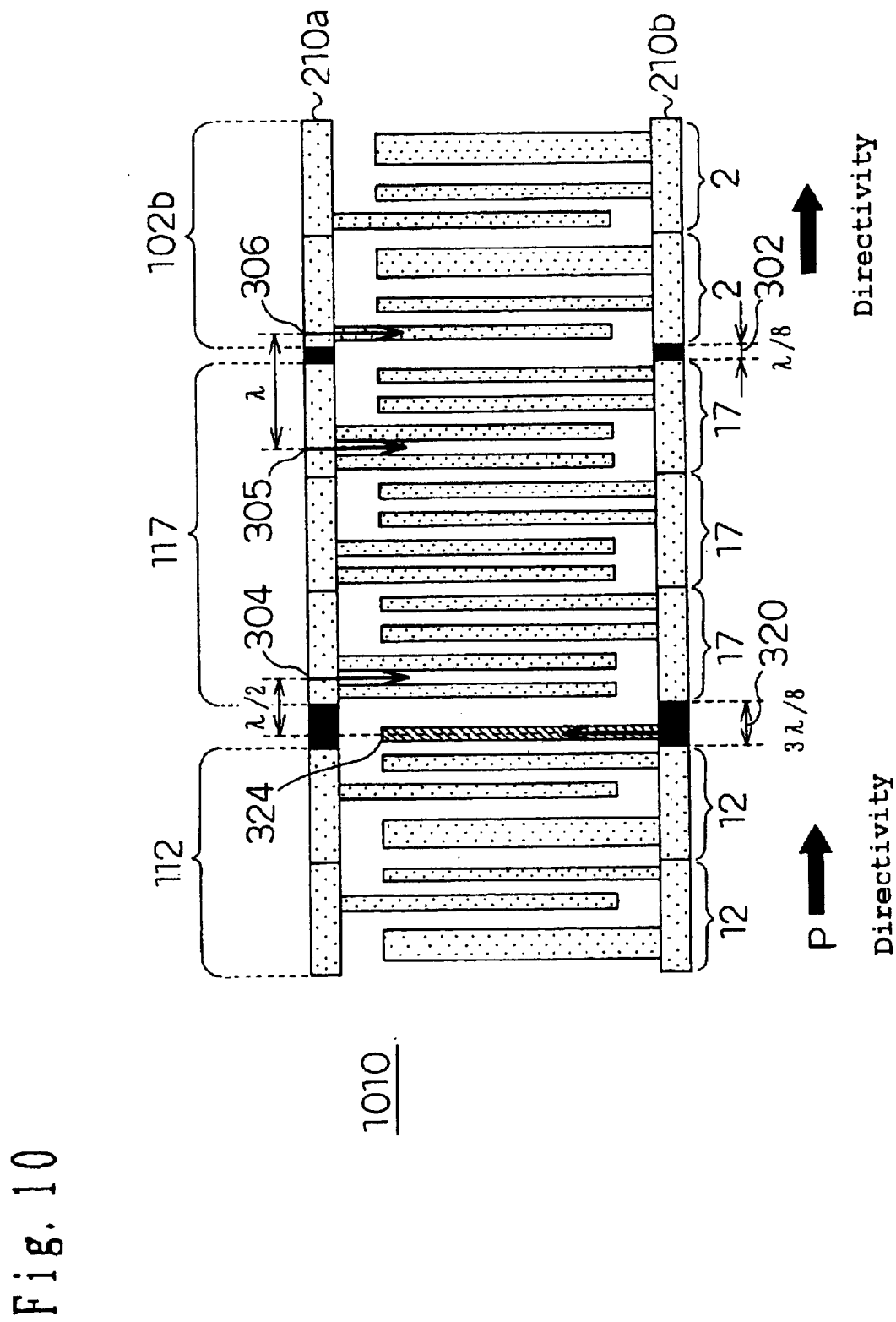
FIG. 10 is a diagram showing a configuration of an IDT according to a tenth embodiment of the present invention.

FIG. 10 shows an IDT 1010 according to this embodiment. The same components as those of the eighth embodiment are denoted by the same reference numerals, and detailed description thereof is omitted.

The IDT 1010 of this embodiment is the same as the eighth embodiment except that an electrode finger 324 connected a lower bus bar electrode 210b is inserted into the area of the adjustment section 320 of the eighth embodiment.

Now, the operation of this embodiment will be described mainly in terms of differences between this embodiment and the eighth embodiment.

As with the eighth embodiment, the space between the excitation centers of the adjacent basic units of the IDT 1010 of this embodiment is adjusted to be equal to the above described wavelength λ. Furthermore, even if the electrode finger 324 is inserted into the area of the adjustment section 320, this and adjacent electrode fingers are prevented from canceling a surface acoustic wave.

Accordingly, the IDT 1010 of this embodiment can be excited without being canceled.

Further, in this embodiment, the wave velocity of a surface acoustic wave can be made uniform in the adjustment section 320 by arranging the electrode finger 324 in the adjustment section 320, as described in the third and fourth embodiments.

(Eleventh Embodiment)

Now, an eleventh embodiment will be described.

Figure 11:
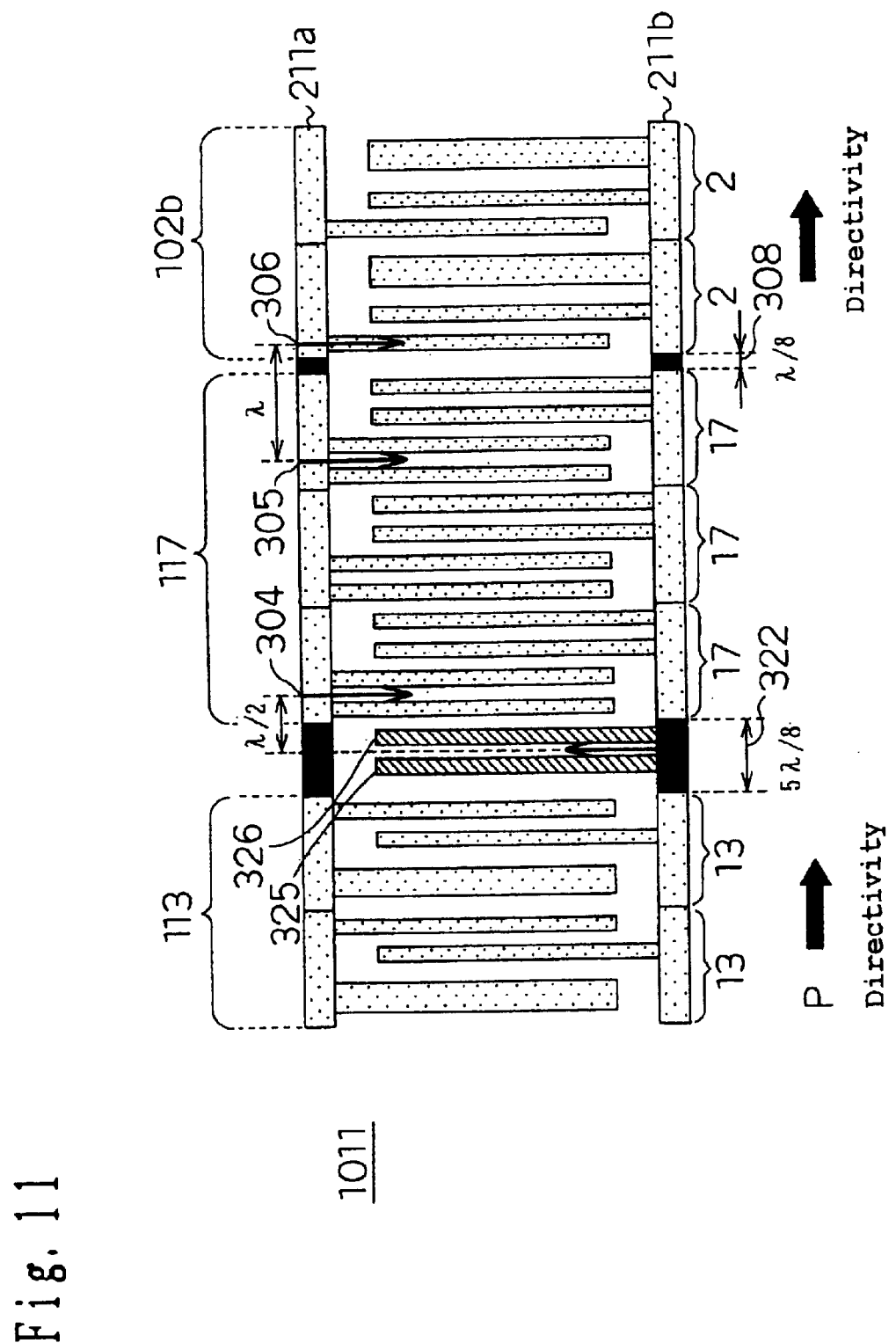
FIG. 11 is a diagram showing a configuration of an IDT according to an eleventh embodiment of the present invention.

FIG. 11 shows an IDT 1011 according to this embodiment. The same components as those of the ninth embodiment are denoted by the same reference numerals, and detailed description thereof is omitted.

The IDT 1011 of this embodiment is the same as the ninth embodiment except that electrode fingers 325 and 326 connected a lower bus bar electrode 211b are inserted into the area of the adjustment section 322 of the ninth embodiment.

Now, the operation of this embodiment will be described mainly in terms of differences between this embodiment and the ninth embodiment.

As with the ninth embodiment, the space between the excitation centers of the adjacent basic units of the IDT 1011 of this embodiment is adjusted to be equal to the above described wavelength λ. Furthermore, even if the electrode fingers 325 and 326 are inserted into the area of the adjustment section 322, these and adjacent electrode fingers are prevented from canceling a surface acoustic wave.

Accordingly, the IDT 1010 of this embodiment produces effects equivalent to those of the ninth embodiment because it propagate a surface acoustic wave without canceling it.

Further, in this embodiment, the wave velocity of a surface acoustic wave can be made uniform in the adjustment section 322 by arranging the electrode fingers 325 and 326 in the adjustment section 322, as described in the third and fourth embodiments.

(Twelfth Embodiment)

Now, a twelfth embodiment will be described.

Figure 16:
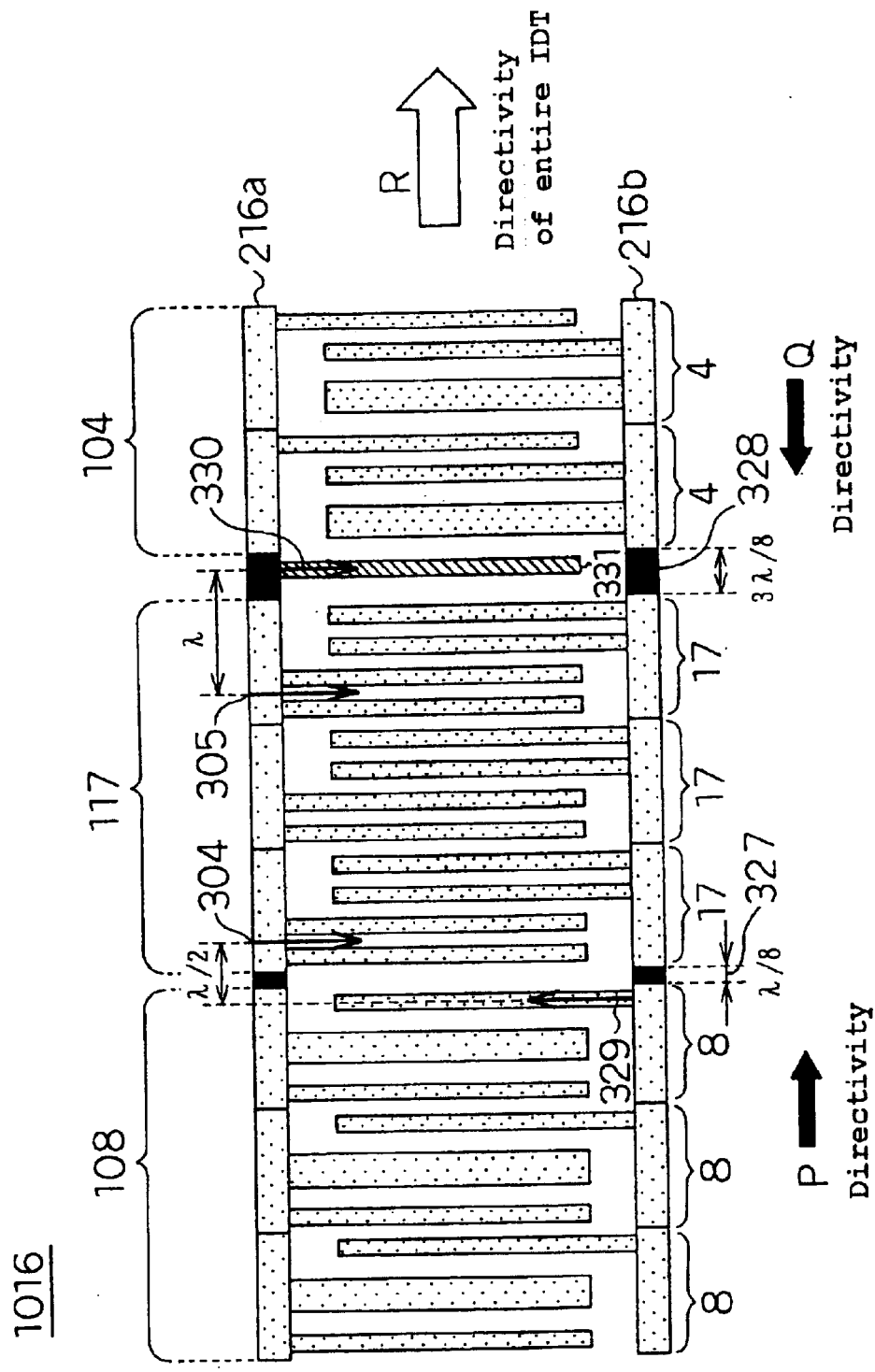
FIG. 16 is a diagram showing a configuration of an IDT according to a twelfth embodiment of the present invention.

FIG. 16 shows an IDT 1016 according to this embodiment. The same components as those of the first embodiment are denoted by the same reference numerals, and detailed description thereof is omitted.

The IDT 1016 of this embodiment is constructed so that the single phase unidirectional transducers 108 and 104 are arranged at the respective sides of the split electrode 117.

The single phase unidirectional transducer 108 is composed of three successive single phase unidirectional transducer units (b1)8. Further, the single phase unidirectional transducer 104 is composed of two successive single phase unidirectional transducer units (a2)4.

Accordingly, the number of electrode figures in the single phase unidirectional transducer 108 is larger than that in the single phase unidirectional transducer 104.

Further, an adjustment section 327 of length λ/8 is provided in an area in which the single phase unidirectional transducer 108 and the split electrode 117 are arranged adjacent to each other. Furthermore, an adjustment section 328 of length 3λ/8 is provided in an area in which the split area 117 and the single phase unidirectional transducer 104 are arranged adjacent to each other.

Moreover, an electrode finger 331 connected an upper bus bar electrode 216a is arranged in the adjustment section 328.

Now, the operation of this embodiment will be described mainly in terms of differences between this embodiment and the first embodiment.

As with the first embodiment, the adjustment sections 327 and 328 are provided, so that the space between an excitation center 329 and the excitation center 304, which are vertically opposite to each other, is equal to λ/2. Further, the space between the excitation center 305 and an excitation center 330, both of which are located at the top of the device, is equal to λ.

Consequently, the IDT 1016 of this embodiment can excite a surface acoustic wave while preventing the basic units from canceling it with each other as in the case with the first embodiment.

However, in contrast to the first embodiment, the single phase unidirectional transducer 108 intensely propagates a surface acoustic wave in the direction P in FIG. 16, whereas the single phase unidirectional transducer 104 intensely propagates a surface acoustic wave in a direction Q opposite to the direction P. Namely, SPUDT 108 has the directivity toward P, and SPUDT 104 has the directivity toward Q.

In this manner, the single phase unidirectional transducers 108 and 104 propagate a surface acoustic wave with each other in the opposite directions. Furthermore, the number of single phase unidirectional transducers 108 is larger than that of single phase unidirectional transducers 104, so that the single phase unidirectional transducers 108 more intensely excites a surface acoustic wave.

Accordingly, the IDT 1016 as a whole intensely propagates a surface acoustic wave in a direction R in FIG. 16. Namely, the IDT 1016 as a whole has the directivity toward R.

The single phase unidirectional transducers having opposite directionalities are thus arranged at the respective sides of the split electrode 117, thereby providing the IDT 1016, which may be called an "R-SPUDT".

In the description of this embodiment, the electrode 331 is arranged in the area of the adjustment section 328. However, effects equivalent to those of this embodiment can be produced without arranging the electrode finger 331.

Further, the wide electrode fingers of the single phase unidirectional transducers 108 and 104 are drawn with each other out from the opposite sides of the device. Furthermore, the number of electrode fingers connected the upper bus bar electrode 216a is the same as the number of electrode fingers connected the lower bus bar electrode 216b. Consequently, if the IDT 1016 is allowed to perform a balanced operation a good balance is obtained.

(Thirteenth Embodiment)

Now, a thirteenth embodiment will be described.

Figure 17:
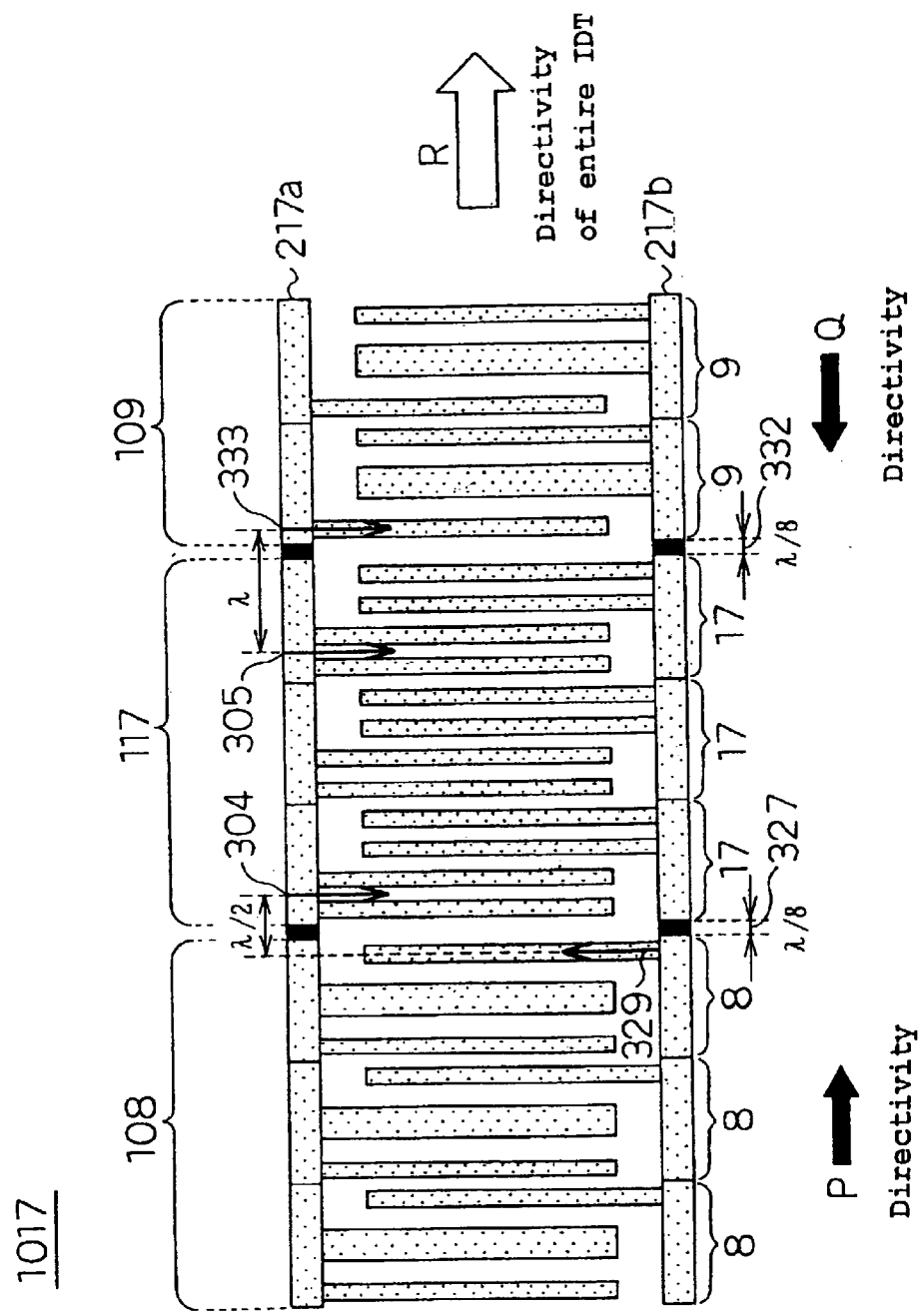
FIG. 17 is a diagram showing a configuration of an IDT according to a thirteenth embodiment of the present invention.

FIG. 17 shows an IDT 1017 according to this embodiment. The same components as those of the twelfth embodiment are denoted by the same reference numerals, and detailed description thereof is omitted.

The IDT 1017 of this embodiment is constructed so that the single phase unidirectional transducers 108 and 109 are arranged at the respective sides of the split electrode 117.

The single phase unidirectional transducer 109 is composed of two successive single phase unidirectional transducer units (b2)9. Further, the single phase unidirectional transducer unit (b2)9 intensely propagates a surface acoustic wave in the direction Q in FIG. 17.

Further, an adjustment section 332 of length $\lambda/8$ is provided between the split electrode 117 and the single phase unidirectional transducer 109.

The other arrangements are similar to those of the twelfth embodiment.

Now, the operation of this embodiment will be described mainly in terms of differences between this embodiment and the twelfth embodiment.

In the IDT 1017 of this embodiment, as with the first embodiment, the adjustment sections 327 and 332 are provided, so that the space between the excitation centers 329 and 304, which are vertically opposite to each other, is equal to $\lambda/2$. Further, the space between the excitation centers 305 and 333, both of which are located at the top of the device, is equal to $\lambda$.

Consequently, the IDT 1017 of this embodiment can excite a surface acoustic wave while preventing the basic units from canceling it with each other as in the case with the first embodiment.

Further, as in the case with the twelfth embodiment, the single phase unidirectional transducer 108 propagates a surface acoustic wave in the direction P in FIG. 17, whereas the single phase unidirectional transducer 109 propagates a surface acoustic wave in the direction Q, which is opposite to the direction P.

In this manner, the single phase unidirectional transducers 108 and 109 propagate a surface acoustic wave in the opposite directions with each other. Furthermore, the number of single phase unidirectional transducers 108 is larger than that of single phase unidirectional transducers 109, so that the single phase unidirectional transducers 108 more intensely excites a surface acoustic wave.

Accordingly, the IDT 1017 as a whole intensely propagates a surface acoustic wave in the direction R in FIG. 17. Namely, the IDT 1017 as a whole has directivity toward R.

In this manner, the single phase unidirectional transducers having the opposite directionalities are arranged at the respective sides of the split electrode 117, thereby providing the IDT 1017, which may be called an "R-SPUDT", as with the twelfth embodiment.

(Fourteenth Embodiment)

Now, a fourteenth embodiment will be described. In this embodiment, description will be given of the basic units of the split electrodes and single phase unidirectional transducers described in the first to thirteenth embodiments. Effects equivalent to those of the above described embodiments can be produced by replacing the basic units of the IDTs described in the embodiments with the basic units described below.

Figure 18:
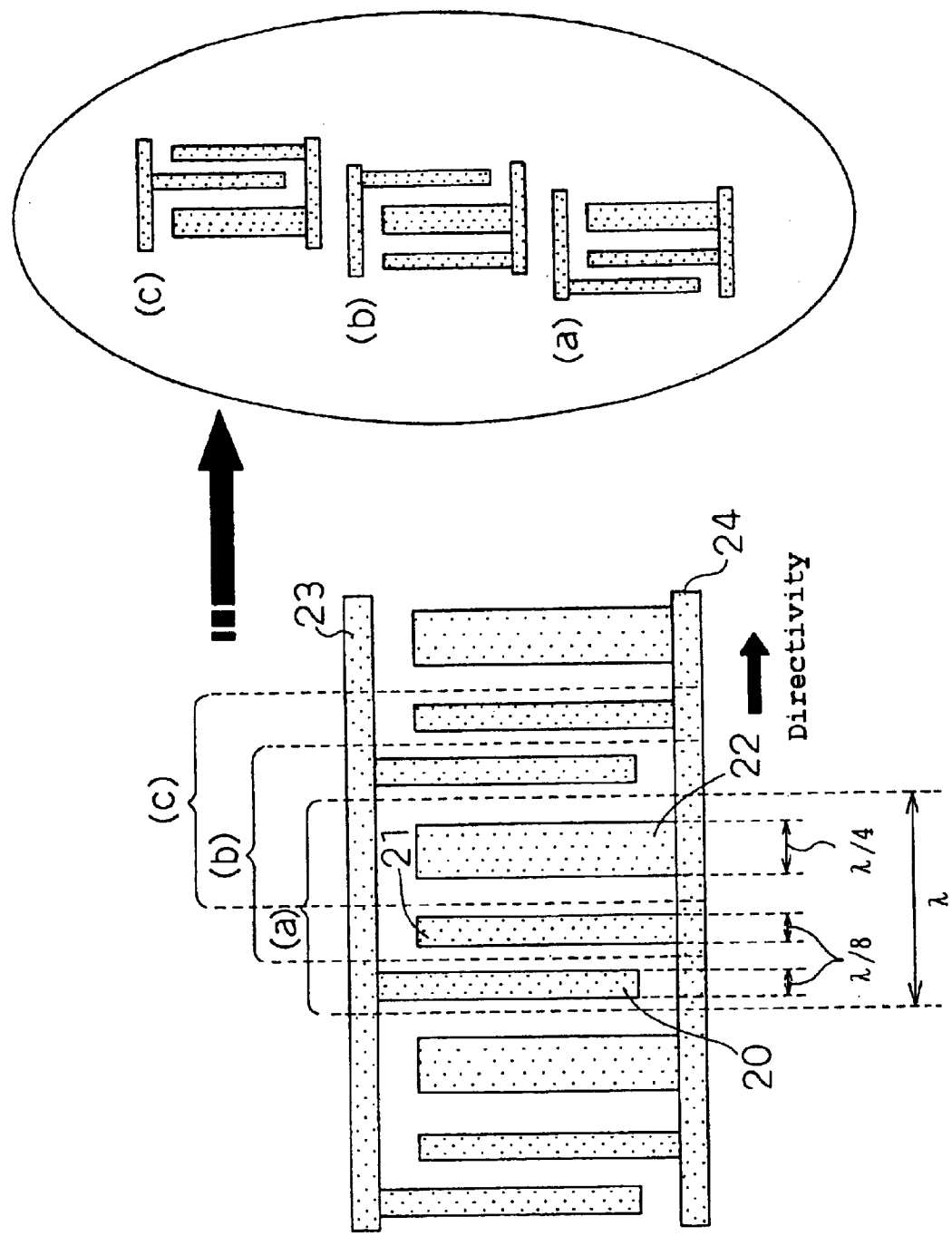
FIG. 18 is a diagram illustrating how basic units are cut out according to a fourteenth embodiment of the present invention.

FIG. 18 shows a method of classifying the basic units.

Three types of basic units a, b, and c are obtained by cutting three portions (a), (b), and (c), shown in the drawing, out of an IDT.

An electrode finger 20 is connected an upper bus bar electrode 23 and has a width of $\lambda/8$. Further, an electrode finger 21 is connected a lower bus bar electrode 24 and also has a width of $\lambda/8$. An electrode finger 22 is connected the lower bus bar electrode 24 and has a width of $\lambda/4$. Furthermore, the cutout three basic units has a length of $\lambda$.

Three other types of basic units can be made by vertically, laterally, and laterally and vertically inverting the above three types of basic units.

Figure 19:
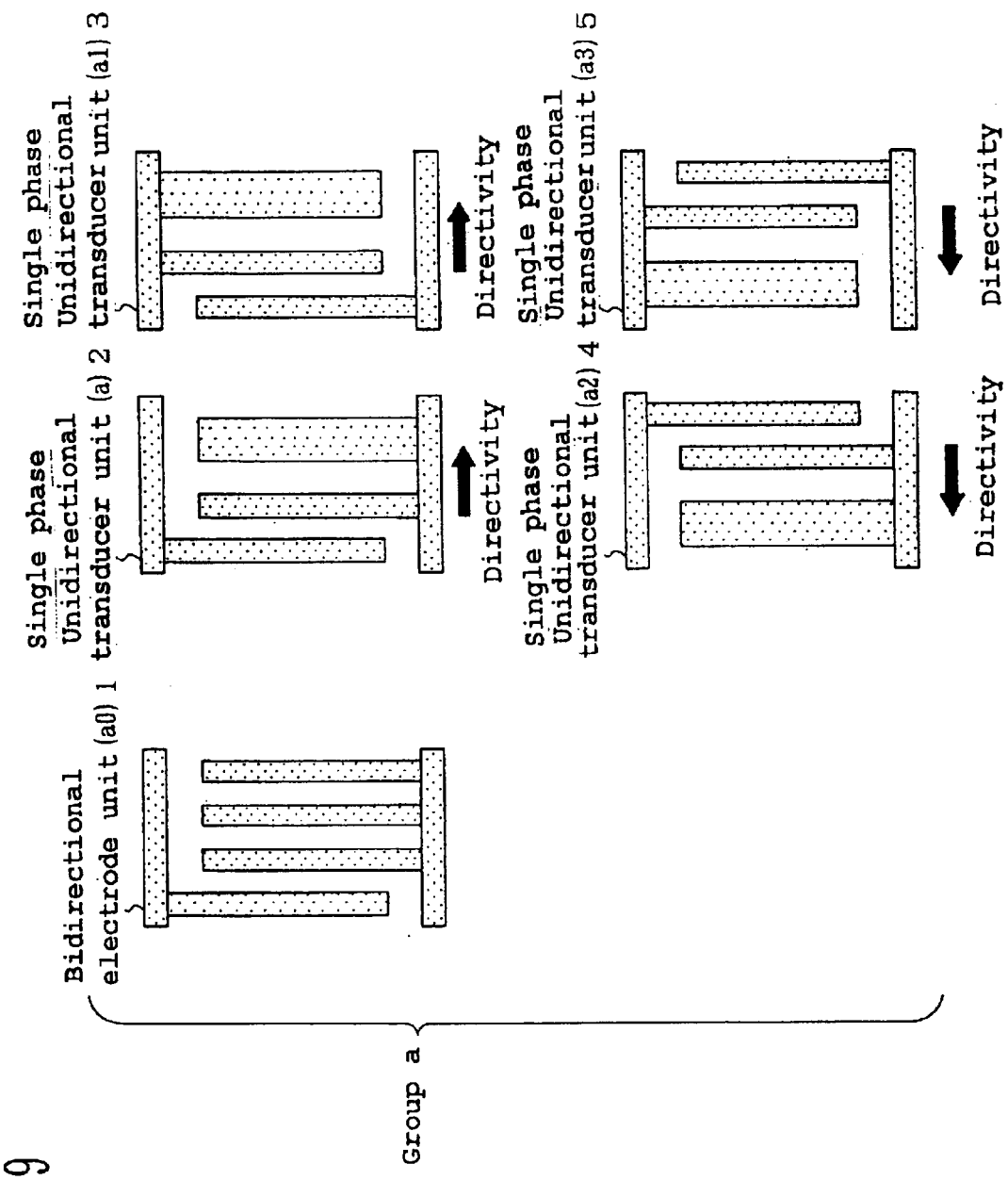
FIG. 19 is a diagram showing basic units belonging to a group a according to the fourteenth embodiment of the present invention.

FIG. 19 shows a group of basic units made from the basic unit a. A single phase unidirectional transducer unit (a)2 has been cut out of the IDT. A single phase unidirectional transducer unit (a1)3 is obtained by vertically inverting the single phase unidirectional transducer unit (a)2. A single phase unidirectional transducer unit (a2)4 is obtained by laterally inverting the single phase unidirectional transducer unit (a)2. A single phase unidirectional transducer unit (a3)5 is obtained by laterally and vertically inverting the single phase unidirectional transducer unit (a)2.

Further, a bidirectional electrode unit (a0)1 can be used with the group (a) of basic units, and can be combined with the single phase unidirectional transducer unit (a)2 to constitute the conventional IDT 1024, described in FIG. 25.

Further, the conventional IDT 1024 may comprise other basic units belong to the group (a) in place of the single phase unidirectional transducers 102a and 102b. In this case, the bidirectional electrode unit (a0)1 may be vertically inverted if the basic unit used is obtained by vertically inverting the single phase unidirectional transducer unit (a)2. On the other hand, the bidirectional electrode unit (a0)1 may be laterally inverted if the basic unit used is obtained by laterally inverting the single phase unidirectional transducer unit (a)2.

In this manner, a large number of IDTs are obtained. However, an IDT with effects equivalent to those of this embodiment is obtained by replacing the bidirectional electrode unit (a0)1 with a split electrode unit 16 (d0) or (e0)17, shown in FIG. 22, and providing the adjustment sections described in the above embodiments so as to prevent the excitation centers from canceling a surface acoustic wave with each other.

Figure 20:
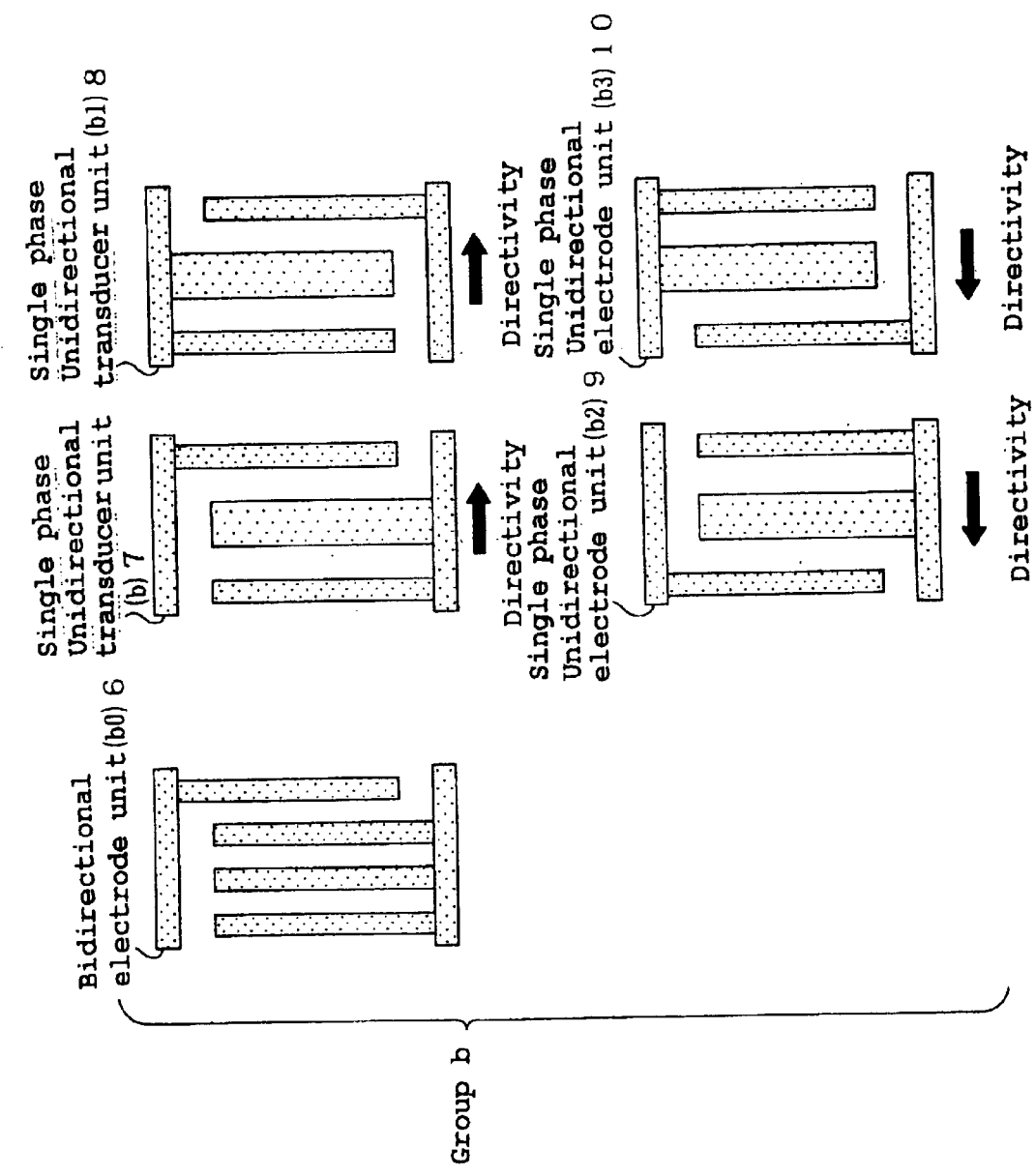
FIG. 20 is a diagram showing basic units belonging to a group b according to the fourteenth embodiment of the present invention.

FIG. 20 shows a group of basic units made from the basic unit b. A single phase unidirectional transducer unit (b)7 has been cut out of the IDT. A single phase unidirectional transducer unit (b1) 8 is obtained by vertically inverting the single phase unidirectional transducer unit (b)7. Further, a single phase unidirectional transducer unit (b2) 9 is obtained by laterally inverting the single phase unidirectional transducer unit (b)7. Furthermore, a single phase unidirectional transducer unit (b3)10 is obtained by laterally and vertically inverting the single phase unidirectional transducer unit (b)7.

Further, a bidirectional electrode unit (b0)6 can be used with the group (b) of basic units, and can be combined with the single phase unidirectional transducer unit (b)7 to constitute an IDT equivalent to the conventional IDT 1024, described in FIG. 25.

Figure 22:
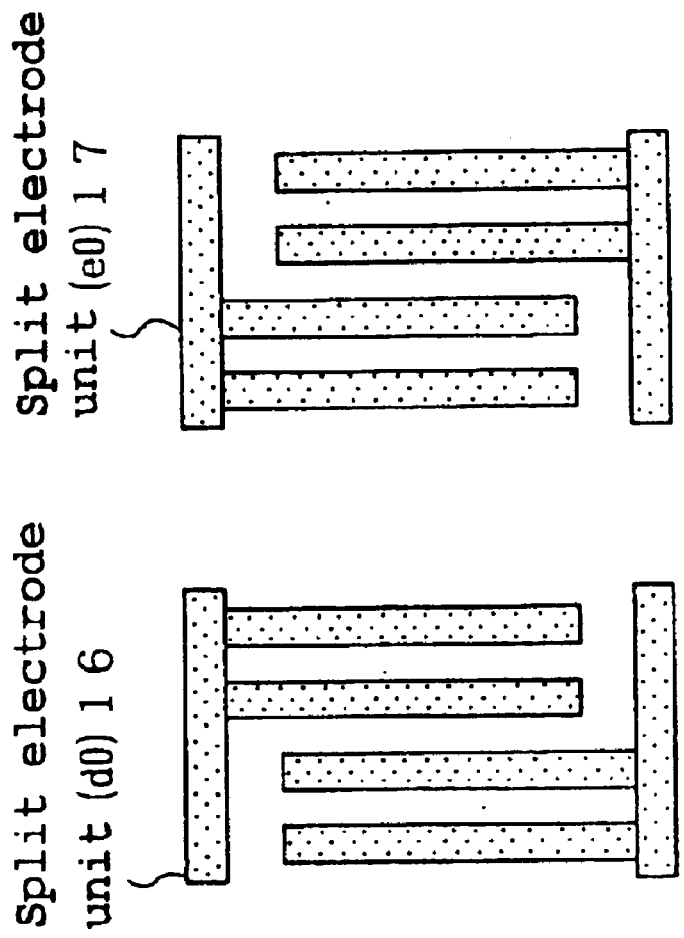
FIG. 22 is a diagram showing basic units of a split electrode according to the fourteenth embodiment of the present invention.

The conventional IDT thus obtained can be provided with effects equivalent to those of this embodiment by replacing the bidirectional electrode unit (b0)6 with the split electrode unit 16(d0) or (e0)17, shown in FIG. 22, and providing the adjustment sections described in the above embodiments so as to prevent the excitation centers from canceling a surface acoustic wave.

Figure 21:
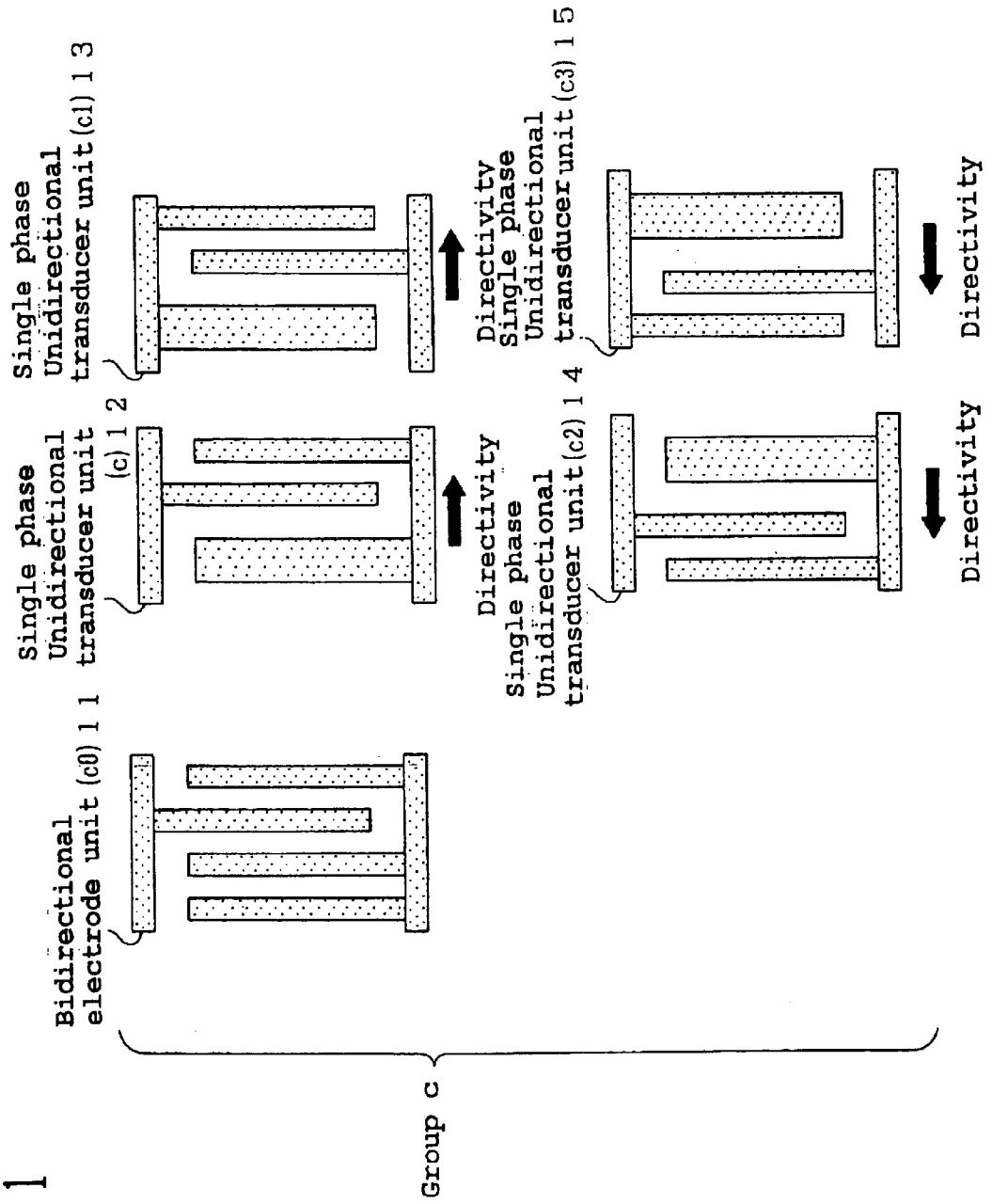
FIG. 21 is a diagram showing basic units belonging to a group c according to the fourteenth embodiment of the sent invention.

Further, FIG. 21 shows a group of basic units made from the basic unit c. A single phase unidirectional transducer unit (c)12 has been cut out of the IDT. A single phase unidirectional transducer unit (c1)13 is obtained by vertically inverting the single phase unidirectional transducer unit (c)12. Further, a single phase unidirectional transducer unit (c2)14 is obtained by laterally inverting the single phase unidirectional transducer unit (c)12. Furthermore, a single phase unidirectional transducer unit (c3)15 is obtained by laterally and vertically inverting the single phase unidirectional transducer unit (c)12.

Further, a bidirectional electrode unit (c0)11 can be used with the group (c) of basic units, and can be combined with the single phase unidirectional transducer unit (c)12 to constitute an IDT equivalent to the conventional IDT 1024, described in FIG. 25.

The conventional IDT thus obtained can be provided with effects equivalent to those of this embodiment by replacing the bidirectional electrode unit (c0)11 with the split electrode unit 16(d0) or (e0)17, shown in FIG. 22, and providing the adjustment sections described in the above embodiments so as to prevent the excitation centers from canceling a surface acoustic wave.

Further, various IDTs with different directionalities with which a surface acoustic wave is propagated are obtained by using at least one type of basic units from each group shown in FIGS. 19, 20, and 21 to form single phase unidirectional transducers arranged on the respective sides of the IDT, using one of the basic units shown in FIG. 22 to form a split electrode arranged in the center of the IDT, and providing the adjustment sections described in the above embodiments. These IDTs can produce effects equivalent to those of the above embodiments.

The split electrode of this embodiment is an example of a bidirectional electrode according to the present invention. The basic unit of this embodiment is an example of a one-wavelength basic unit according to the present invention.

In the description of this embodiment, the single phase unidirectional transducer is composed of two or three successive basic units. However, the present invention is not limited to this aspect, but the single phase unidirectional transducer may be composed of four or five or more successive basic units. In short, the single phase unidirectional transducer has only to be composed of at least one successive basic unit. Other basic units are possible. These basic units are similar to those described in the above embodiments in that they require adjustment sections, which may vary depending on their definitions.

Furthermore, in the description of this embodiment, the split electrode is composed of three successive basic units. However, the present invention is not limited to this aspect, but the split electrode may be composed of four or five or more successive basic units. In short, the split electrode has only to be composed of at least one successive basic unit.

Moreover, the arrangement of the unidirectional and bidirectional electrodes is limited to those described in the above described embodiments. These electrodes may be arranged at arbitrary positions by carrying out weighting so as to obtain the desired filter characteristic. In this case, efficiency is improved with a loss reduced compared to the use of the conventional bidirectional electrode provided that an adjustment section of length $(2M-1) \lambda/8$ (M is an integer equal to or larger than 1) is provided so that the IDT includes an area in which the phases of excitation centers are matched.

Further, in the above description, all electrodes are excitation electrodes. However, the same basic concept is applicable even if the IDT includes non-excitation electrodes in which all electrodes are connected to only one of the bus bar electrodes.

Further, in the description of this embodiment, the phases of the excitation centers of all basic units are matched. However, with phase weighting or the like, effects equivalent to those of this embodiment can be produced even if some basic units are not in phase with the others.

Furthermore, in the above description, the wide electrode fingers of the single phase unidirectional transducer has a width of $\lambda/4$. However, the present invention is not limited to this aspect, but these electrode fingers may have a different width, for example, $3\lambda/8$.

(Fifteenth Embodiment)

Now, a fifteenth embodiment will be described.

Figure 24:
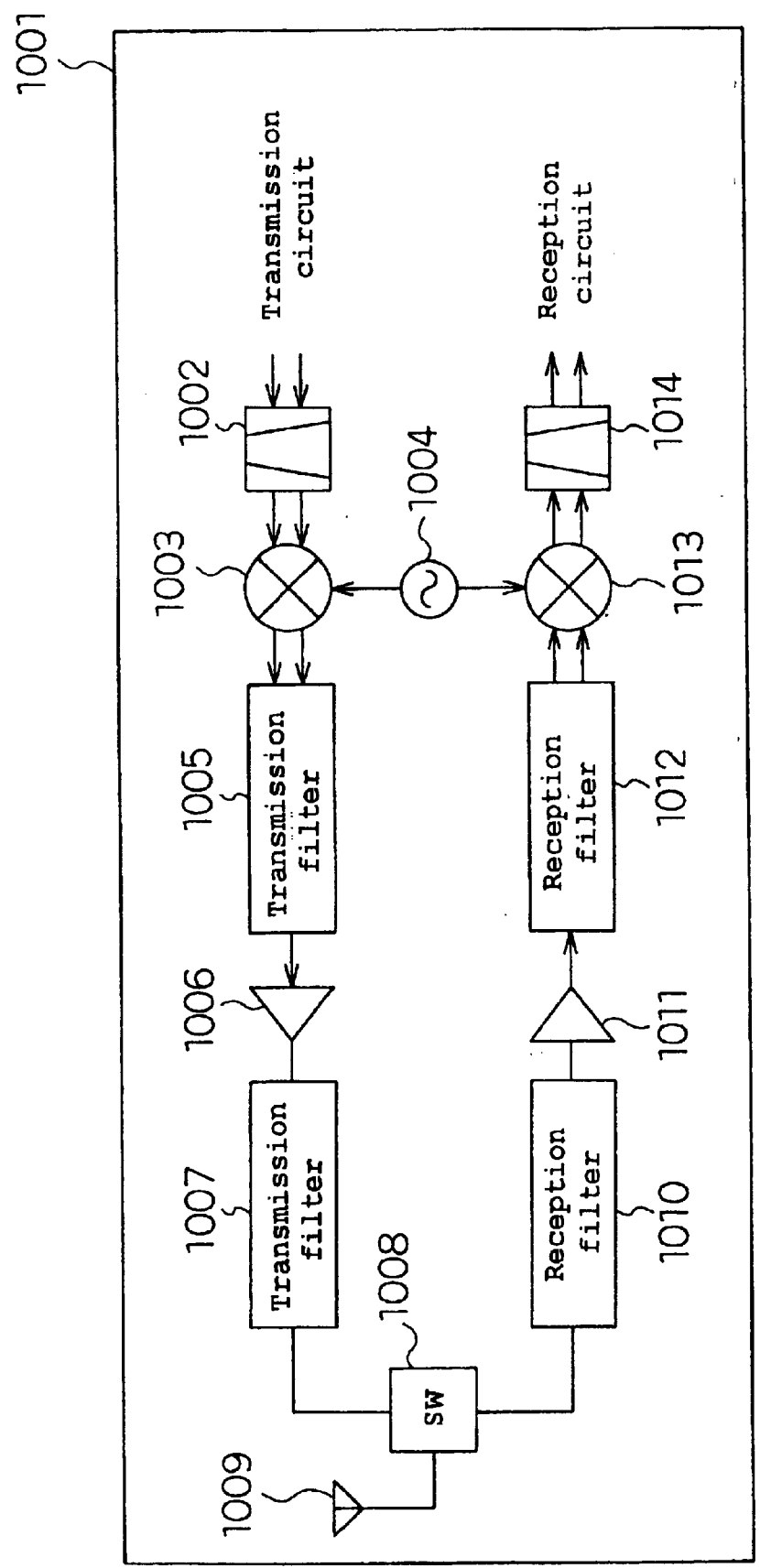
FIG. 24 is a block diagram showing a configuration of communication equipment using the SAW filter according to the fifteenth embodiment.

FIG. 24 is a block diagram of communication equipment 2001 of this embodiment.

The communication equipment 2001 of this embodiment incorporates a surface acoustic wave filter composed of the IDT described in any of the above described embodiments.

That is, in FIG. 24, a transmitted signal output by a transmission circuit is transmitted to a mixer 2003 via a surface acoustic wave filter 2002. The transmitted signal input to the mixer 2003 is up-converted by a local signal from a transmitter 2004. The converted signal is transmitted to an antenna 2009 via a transmission filter 2005, an amplifier 2006, a transmission filter 2007, and a switch 2008.

On the other hand, the received signal received from the antenna 2009 is input to a mixer 2013 via the switch 2008, a reception filter 2010, an amplifier 2011, and a reception filter 2012. The received signal input to the mixer 2013 is down-converted by a local signal from the transmitter 2004. The converted signal is transmitted to a reception circuit via a surface acoustic wave filter 2014.

Then, efficient communication equipment 2001 with a reduced loss can be provided by applying the surface acoustic wave filter of this embodiment to the surface acoustic wave filter 2002 of the communication equipment 2001 or the surface acoustic wave filter 2014. Further, high-performance communication equipment can be provided which can prevent modulation accuracy from being degraded during transmission owing to the degradation of a balance characteristic and which can prevent sensitivity from being degraded during reception owing to the degradation if the balance characteristic.

In this embodiment, the transmitted and received signals are connected to the antenna 2009 and then switched by the switch 2008. However, a shared device can be used for this purpose.

Further, in this embodiment, the surface acoustic wave filter is of a balance-balance type. However, it may be of an unbalance-unbalance type.

That is, radio communication equipment belongs to the present invention which comprises a transmission circuit outputting a transmitted wave and a reception circuit accepting a received wave as an input, and in which the transmission circuit and/or reception circuit is composed of the surface acoustic wave filter of the present invention.

The radio communication apparatus of the present invention includes a mobile radio apparatus such as a cellular phone, a PHS, a car telephone, a train telephone, a ship telephone, an airplane telephone, a codeless telephone, or a pager.

As is apparent from the above description, the present invention provides an interdigital transducer, a surface acoustic wave filter, and a radio communication apparatus which operate efficiently and undergoes a reduced loss.

What is claimed is:

1. An interdigital transducer comprising:

a plurality of one-wavelength basic units of a single phase unidirectional transducer each having three electrode fingers within one wavelength;

an upper bus bar electrode from which some of said electrode fingers are connected; and a lower bus bar electrode from which the other electrode fingers are connected, wherein one of the three electrode fingers of each one-wavelength basic unit of said single phase unidirectional transducer is wider than the two other electrode fingers, and said single phase unidirectional transducer comprises at least two sections, and wide electrode fingers of those one-wavelength basic units of said single phase unidirectional transducer which constitute one section of said single phase unidirectional transducer are connected to one of said upper bus bar electrode or said lower bus bar electrode, and wide electrode fingers of those one-wavelength basic units of said single phase unidirectional transducer which constitute the other section of said single phase unidirectional transducer are connected to the other of said upper bus bar electrode or said lower bus bar electrode.

2. The interdigital transducer according to claim 1, wherein signals directly or indirectly input by a pair of balanced terminals are input to said upper bus bar electrode and said lower bus bar electrode, or signals directly or indirectly output to the pair of balanced terminals by said upper bus bar electrode and said lower bus bar electrode are output by said upper bus bar electrode and said lower bus bar electrode.

3. An interdigital transducer comprising:

a plurality of one-wavelength basic units of a single phase unidirectional transducer each having three electrode fingers within one wavelength; and a plurality of one-wavelength basic units of a bidirectional electrode each having four electrode fingers within said one wavelength, wherein one of the three electrode fingers of each one-wavelength basic unit of said single phase unidirectional transducer is wider than the two other electrode fingers, and of the four electrode fingers of each one-wavelength basic unit of said bidirectional electrode, one pair of two fingers is interdigitated to the other pair of two fingers, and an adjustment section is provided between the one-wavelength basic units of said single phase unidirectional transducer and the one-wavelength basic units of said bidirectional electrode, and provision of said adjustment section means that in an area where a one-wavelength basic unit of said single phase unidirectional transducer and a one-wavelength basic unit of said bidirectional electrode are adjacent to each other, the space between an adjacent-side end of the one-wavelength basic unit of the single phase unidirectional transducer and an adjacent-side end of the one-wavelength basic unit of the corresponding bidirectional electrode is 2(M−1)/8 as large as said one wavelength, where M is an integer equal to or larger than 1.

4. A surface acoustic wave filter comprising:

a piezoelectric substrate;

an input electrode formed on said piezoelectric substrate; and an output electrode formed on said piezoelectric substrate, wherein the interdigital transducer according to any one of claims 1 to 3 is used in at least a part of said input electrode and said output electrode.

5. A radio communication apparatus comprising:

a transmission circuit that outputs a transmitted wave; and a reception circuit that accepts a received wave as an input, wherein at least one of said transmission circuit or said reception circuit comprises the surface acoustic wave filter according to claim 4.

6. The interdigital transducer according to claim 1 or claim 3, wherein the interdigital transducer further comprises at least two types of one-wavelength basic units of the single phase unidirectional transducer, directivity of said one-wavelength basic units of the single phase unidirectional transducer and directivity of the other one-wavelength basic units of the single phase unidirectional transducer are of opposite directivity to each other.

* * * * *

UNITED STATES PATENT AND TRADEMARK OFFICE
CERTIFICATE OF CORRECTION

PATENT NO. : 6,870,302 B2  Page 1 of 1
DATED : March 22, 2005
INVENTOR(S) : Hiroyuki Nakamura et al.

It is certified that error appears in the above-identified patent and that said Letters Patent is hereby corrected as shown below:

Title page,
Item [75], Inventors, "Katano" should read -- Osaka -- and "Yawata" should read -- Kyoto --.

Column 25,
Line 25, after "transducer", insert -- , --.

Signed and Sealed this

Twenty-third Day of August, 2005

JON W. DUDAS
*Director of the United States Patent and Trademark Office*